United States Patent
Yun et al.

(10) Patent No.: US 12,349,437 B2
(45) Date of Patent: Jul. 1, 2025

(54) METHOD OF FABRICATING A SEMICONDUCTOR DEVICE INCLUDING SOURCE/DRAIN CONTACTS HAVING DIFFERENT HEIGHTS AND DIFFERENT WIDTHS

(71) Applicant: SAMSUNG ELECTRONICS CO., LTD., Suwon-si (KR)

(72) Inventors: Byungeun Yun, Hwaseong-si (KR); Jun-Gu Kang, Hwaseong-si (KR); Dong-Il Park, Hwaseong-si (KR); Yongsang Jeong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 498 days.

(21) Appl. No.: 17/406,257

(22) Filed: Aug. 19, 2021

(65) Prior Publication Data
US 2021/0384304 A1    Dec. 9, 2021

Related U.S. Application Data

(63) Continuation of application No. 16/662,258, filed on Oct. 24, 2019, now Pat. No. 11,114,533.

(30) Foreign Application Priority Data

Mar. 19, 2019   (KR) ........................ 10-2019-0031256

(51) Int. Cl.
*H10D 64/23*    (2025.01)
*H01L 23/522*   (2006.01)
(Continued)

(52) U.S. Cl.
CPC ....... *H10D 64/251* (2025.01); *H01L 23/5226* (2013.01); *H01L 23/5283* (2013.01);
(Continued)

(58) Field of Classification Search
CPC ....... H01L 29/40–42368; H01L 23/5226–535; H10D 64/251–259; H10D 64/514–516; H10D 87/00; H10D 84/83
See application file for complete search history.

(56) References Cited

U.S. PATENT DOCUMENTS 5,912,188 A * 6/1999 Gardner ............ H01L 21/76814
                                                    257/E21.59
6,720,242 B2   4/2004 Burbach et al.
(Continued)

FOREIGN PATENT DOCUMENTS

| KR | 10-0801707 | 2/2008 |
|---|---|---|
| KR | 10-0907883 | 7/2009 |
| KR | 10-2014-0101218 | 8/2014 |

*Primary Examiner* — Syed I Gheyas
*Assistant Examiner* — Casey Paul Boatman
(74) *Attorney, Agent, or Firm* — MORGAN, LEWIS & BOCKIUS LLP

(57) ABSTRACT

A method for forming a semiconductor device includes: providing a substrate including a first and second region; forming a first gate dielectric pattern and a first gate electrode on the first region; forming a second gate dielectric pattern and a second gate electrode on the second region; forming an interlayer dielectric layer on the substrate; forming first source/drain contact holes penetrating the interlayer dielectric layer on the first region; and forming second source/drain contact holes penetrating the interlayer dielectric layer on the second region. A thickness of the second gate dielectric pattern is greater than a thickness of the first gate dielectric pattern. A height of each of the second source/drain contact holes is greater than a height of each of the first source/drain contact holes. A width of each of the second source/drain contact holes is greater than a width of each of the first source/drain contact holes.

14 Claims, 18 Drawing Sheets

(51) Int. Cl.
  *H01L 23/528* (2006.01)
  *H01L 23/535* (2006.01)
  *H10D 64/27* (2025.01)
  *H10D 84/83* (2025.01)
  *H10D 87/00* (2025.01)

(52) U.S. Cl.
  CPC ......... *H01L 23/535* (2013.01); *H10D 64/259* (2025.01); *H10D 64/514* (2025.01); *H10D 64/516* (2025.01); *H10D 84/83* (2025.01); *H10D 87/00* (2025.01)

(56) References Cited

U.S. PATENT DOCUMENTS

| | | | |
|---|---|---|---|
| 6,828,240 B2 | 12/2004 | Hellig et al. | |
| 6,830,978 B2 | 12/2004 | Ariyoshi et al. | |
| 7,741,673 B2 | 6/2010 | Tak et al. | |
| 9,012,281 B2 | 4/2015 | Suk et al. | |
| 9,171,758 B2 | 10/2015 | Chowdhury et al. | |
| 9,245,791 B2 | 1/2016 | Lin et al. | |
| 9,305,935 B2 | 4/2016 | Lee et al. | |
| 9,508,640 B2 | 11/2016 | Cheng et al. | |
| 9,646,994 B2 | 5/2017 | Liu et al. | |
| 9,899,417 B2 | 2/2018 | Flachowsky et al. | |
| 9,935,003 B2 | 4/2018 | Bu et al. | |
| 9,935,125 B2 | 4/2018 | Tsunomura et al. | |
| 2009/0218632 A1 | 9/2009 | Cheng | |
| 2011/0062502 A1* | 3/2011 | Yin | H01L 29/66545 257/E21.409 |
| 2013/0264644 A1* | 10/2013 | Tsunomura | H10D 30/0275 257/350 |
| 2014/0225198 A1* | 8/2014 | Suk | H01L 27/0922 257/369 |
| 2015/0294984 A1 | 10/2015 | Cheng et al. | |
| 2015/0348909 A1* | 12/2015 | Yamazaki | H10D 86/60 438/638 |
| 2016/0118496 A1 | 4/2016 | Anderson et al. | |
| 2017/0194320 A1 | 7/2017 | Chen et al. | |
| 2018/0277534 A1* | 9/2018 | Huang | H10D 84/038 |
| 2018/0294261 A1* | 10/2018 | Liang | H01L 29/1095 |
| 2020/0027964 A1* | 1/2020 | Cheng | H01L 21/823462 |
| 2020/0303508 A1 | 9/2020 | Yun et al. | |

\* cited by examiner

METHOD OF FABRICATING A SEMICONDUCTOR DEVICE INCLUDING SOURCE/DRAIN CONTACTS HAVING DIFFERENT HEIGHTS AND DIFFERENT WIDTHS

CROSS-REFERENCE TO RELATED APPLICATIONS

This U.S. nonprovisional application is a continuation of U.S. patent application Ser. No. 16/662,258 filed on Oct. 24, 2019, which claims prior under 35 U.S.C § 119 to Korean Patent Application No. 10-2019-0031256 filed on Mar. 19, 2019 in the Korean Intellectual Property Office, the disclosures of which are incorporated by reference herein in their entireties.

TECHNICAL FIELD

The present inventive concept relates to a semiconductor device, and more particularly, to a semiconductor device including a field effect transistor.

DISCUSSION OF THE RELATED ART

Generally, a semiconductor device may include an integrated circuit consisting of metal oxide semiconductor field effect transistors (MOSFETs). The integrated circuit of the semiconductor device may be configured to include transistors having different electrical and/or operating characteristics. As sizes and designs of the semiconductor device are gradually decreased and scaled down, sizes of the MOSFETs are also increasingly scaled down. The scale down of MOSFETs may deteriorate operating characteristics of the semiconductor device. Accordingly, research is being conducted to further develop semiconductor devices having superior performance.

SUMMARY

According to an exemplary embodiment of the present inventive concept, a semiconductor device includes: a substrate including a first region and a second region; a first gate stack on the first region of the substrate; a first source/drain contact at a first side of the first gate stack, wherein the first source/drain contact is connected to the substrate; a second gate stack on the second region of the substrate; and a second source/drain contact at a first side of the second gate stack, wherein the second source/drain contact is connected to the substrate, wherein a height of the second source/drain contact is greater than a height of the first source/drain contact, and wherein a width of the second source/drain contact is greater than a width of the first source/drain contact.

According to an exemplary embodiment of the present inventive concept, a semiconductor device includes: a substrate including a lower semiconductor layer, an upper semiconductor layer, and an insulating layer between the lower and upper semiconductor layers, wherein the substrate has a first region and a second region, and wherein the upper semiconductor layer and the insulating layer are provided on the first region; a first gate stack on the upper semiconductor layer of the first region; a first source/drain contact at a first side of the first gate stack, wherein the first source/drain contact is connected to the upper semiconductor layer; a second gate stack on the lower semiconductor layer of the second region; and a second source/drain contact at a first side of the second gate stack, wherein the second source/drain contact is connected to the lower semiconductor layer, wherein a height of the second source/drain contact is different from a height of the first source/drain contact, and wherein a width of the second source/drain contact is different from a width of the first source/drain contact.

DETAILED DESCRIPTION OF THE EMBODIMENTS

Exemplary embodiments of the present inventive concept will now be described more fully hereinafter with reference to the accompanying drawings.

Figure 1:
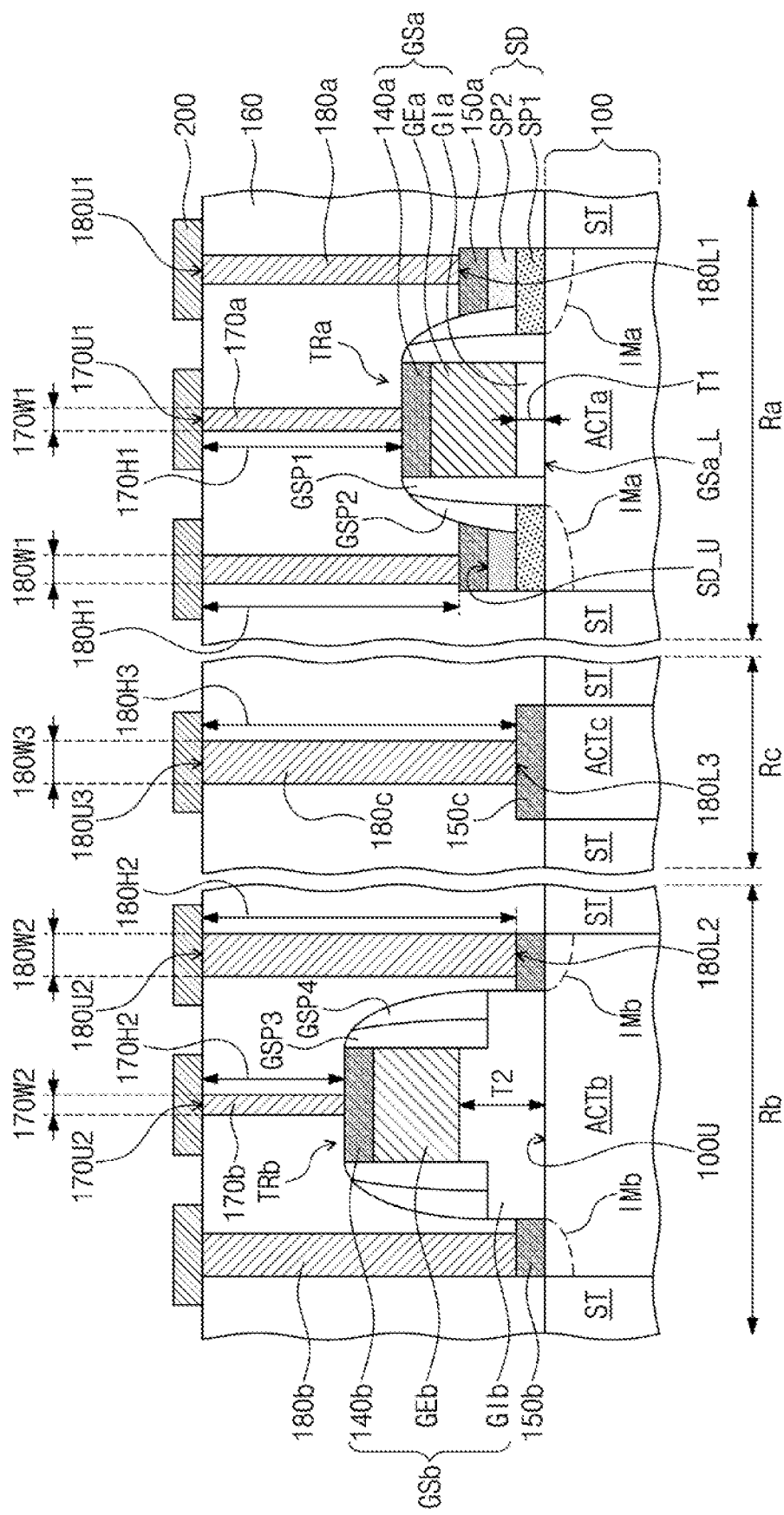
FIG. 1 illustrates a cross-sectional view showing a semiconductor device according to an exemplary embodiment of the present inventive concept.

FIG. 1 illustrates a cross-sectional view showing a semiconductor device according to an exemplary embodiment of the present inventive concept.

Referring to FIG. 1, device isolation patterns ST may be provided in a substrate 100, and active patterns ACTa, ACTb, and ACTc may be provided adjacent to the device isolation patterns ST in the substrate 100. The device isolation patterns ST may penetrate an upper portion of the substrate 100 and extend into the substrate 100. The active patterns ACTa, ACTb, and ACTc may be portions of the substrate 100 that are interposed between the device isolation patterns ST. The substrate 100 may include a first region Ra, a second region Rb, and a third region Rc. The first and second regions Ra and Rb may be areas on which field effect transistors are provided, and the third region Rc may be an area on which is provided an element that applies a body bias to a corresponding one of the transistors. The active patterns ACTa, ACTb, and ACTc may include a first active pattern ACTa on the first region Ra, a second active pattern ACTb on the second region Rb, and a third active pattern ACTc on the third region Rc. The substrate 100 may be a semiconductor substrate (e.g., a silicon substrate or a germanium substrate). The device isolation patterns ST may include, for example, oxide, nitride, or oxynitride.

A first gate stack GSa may be disposed on the first region Ra of the substrate 100. The first gate stack GSa may be placed on the first active pattern ACTa. The first gate stack GSa may include a first gate dielectric pattern GIa, a first gate electrode GEa, and a first gate ohmic pattern 140*a* that are sequentially stacked on the substrate 100 (e.g., on the first active pattern ACTa). The first gate dielectric pattern GIa may be interposed between the first active pattern ACTa and the first gate electrode GEa, and the first gate ohmic pattern 140*a* may be disposed on the first gate electrode GEa. The first gate dielectric pattern GIa may have a first thickness T1.

The first gate dielectric pattern GIa may include, for example, one or more of a silicon oxide layer, a silicon nitride layer, a silicon oxynitride layer, and/or a high-k dielectric layer. The high-k dielectric layer may include a material, such as hafnium oxide (HfO), aluminum oxide (AlO), or tantalum oxide (TaO), whose dielectric constant is greater than that of a silicon oxide layer. The first gate electrode GEa may include a conductive material. The first gate electrode GEa may include, for example, one or more of a doped semiconductor material, conductive metal nitride (e.g., titanium nitride or tantalum nitride), or metal (e.g., aluminum or tungsten). For example, the first gate ohmic pattern 140*a* may include metal silicide.

First gate spacers GSP1 may be disposed on and cover lateral surfaces of the first gate stack GSa. Second gate spacers GSP2 may be disposed on the lateral surfaces of the first gate stack GSa. Each of the first gate spacers GSP1 may be interposed between a corresponding one of the second gate spacers GSP2 and a corresponding lateral surface of the first gate stack GSa. The first and second gate spacers GSP1 and GSP2 may include one or more of an oxide layer, a nitride layer, and/or an oxynitride layer. For example, the first and second gate spacers GSP1 and GSP2 may include one or more of a silicon oxide layer, a silicon nitride layer, and/or a silicon oxynitride layer.

Source/drain patterns SD may be disposed on the substrate 100 on opposite sides of the first gate stack GSa. The source/drain patterns SD may be placed on the first active pattern ACTa. Each of the source/drain patterns SD may be spaced apart from the first gate stack GSa by a corresponding one of the first gate spacers GSP1 and a corresponding one of the second gate spacers GSP2. The corresponding first gate spacer GSP1 and the corresponding second gate spacer GSP2 may be interposed between the first gate stack GSa and each of the source/drain patterns SD. For example, each source/drain pattern. SD is disposed on a lateral surface of a corresponding first gate spacer GSP1 and a lateral surface of a corresponding second gate spacer GSP2.

In an exemplary embodiment of the present inventive concept, each of the source/drain patterns SD may include a first semiconductor pattern SP1 and a second semiconductor pattern SP2 that are sequentially stacked on the substrate 100. The first semiconductor pattern SP1 may be disposed between the corresponding second gate spacer GSP2 and the substrate 100 (e.g., between the corresponding second gate spacer GSP2 and the first active pattern ACTa), and the first semiconductor pattern SP1 may contact the corresponding first gate spacer GSP1. The second semiconductor pattern SP2 may be spaced apart from the corresponding first gate spacer GSP1 by the corresponding second gate spacer GSP2. The corresponding second gate spacer GSP2 may be interposed between the corresponding first gate spacer CUSP I and the second semiconductor pattern SP2. Each of the first and second semiconductor patterns SP1 and SP2 may include, for example, one or more of silicon (Si), silicon carbide (SiC), and/or silicon-germanium (SiGe).

First impurity-doped regions IMa may be disposed in the substrate 100 on opposite sides of the first gate stack GSa. The first impurity-doped regions IMa may be placed in the first active pattern ACTa, and the source/drain patterns SD may be disposed on corresponding first impurity-doped regions IMa. The source/drain patterns SD may be connected to corresponding first impurity-doped regions IMa. A first transistor TRa may be configured to include the first gate stack GSa, the source/drain patterns SD, and the first impurity-doped regions IMa. The source/drain patterns SD and the first impurity-doped regions IMa may include impurities doped therein. When the first transistor TRa is an NMOSFET, the impurities may be N-type impurities (e.g., phosphorous (P) or arsenic (As)). When the first transistor TRa is a PMOSFET, the impurities may be P-type impurities (e.g., boron (B)). In an exemplary embodiment of the present inventive concept, the first transistor TRa may constitute a logic circuit.

First ohmic patterns 150*a* may be disposed on corresponding source/drain patterns SD. Each of the first ohmic patterns 150*a* may be placed on an uppermost surface SD_U of a corresponding one of the source/drain patterns SD, and the uppermost surface SD_U of each of the source/drain patterns SD may be located at a higher level than that of a bottom surface GSa_L of the first gate stack GSa. In this description, the term "level" means a distance measured from a top surface 100U of the substrate 100. Each of the first ohmic patterns 150*a* may be in contact with the uppermost surface SD_U of a corresponding one of the source/drain patterns SD. For example, the first ohmic patterns 150*a* may include metal silicide.

A first gate contact 170*a* may be disposed on the first gate stack GSa. The first gate ohmic pattern 140*a* may be interposed between the first gate electrode GEa and the first gate contact 170*a*, and the first gate contact 170*a* may be connected to the first gate electrode GEa through the first gate ohmic pattern 140*a*. First source/drain contacts 180*a* may be disposed on corresponding source/drain patterns SD. Each of the first source/drain contacts 180*a* may be placed on the uppermost surface SD_U of a corresponding one of the source/drain patterns SD. Each of the first ohmic patterns 150*a* may be interposed between a corresponding one of the source/drain patterns SD and a corresponding one of the first source/drain contacts 180*a*. The first source/drain contacts 180*a* may be connected to the source/drain patterns SD through the first ohmic patterns 150*a*. For example, the first gate contact 170*a* and the first source/drain contacts 180*a* may include conductive metal nitride and/or metal.

The first gate contact 170*a* and the first source/drain contacts 180*a* may each have a vertical length (or, e.g., a height) measured along a direction perpendicular to the top surface 100U of the substrate 100. Each of the first source/drain contacts 180*a* may have a height 180H1 greater than a height 170H1 of the first gate contact 170*a*. The first gate contact 170*a* and the first source/drain contacts 180*a* may each have a width measured along a direction parallel to the top surface 100U of the substrate 100. In an exemplary embodiment of the present inventive concept, each of the first source/drain contacts 180*a* may have a width 180W1 greater than a width 170W1 of the first gate contact 170*a*. In an exemplary embodiment of the present inventive concept, the width 180W1 of each of the first source/drain contacts 180*a* may be the same as or less than the width 170W1 of the first gate contact 170*a*.

A second gate stack GSb may be disposed on the second region Rb of the substrate 100. The second gate stack GSb may be placed on the second active pattern ACTb. The second gate stack GSb may include a second gate dielectric pattern GIb, a second gate electrode GEb, and a second gate ohmic pattern 140*b* that are sequentially stacked on the substrate 100 (e.g., on the second active pattern ACTb). The second gate dielectric pattern GIb may be interposed between the second active pattern ACTb and the second gate electrode GEb, and the second gate ohmic pattern 140b may be disposed on the second gate electrode GEb. The second gate dielectric pattern GIb may have a second thickness T2 greater than the first thickness T1 of the first gate dielectric pattern GIa. However, the present inventive concept is not limited thereto. For example, the second thickness T2 may be equal to or less than the first thickness T1.

In an exemplary embodiment of the present inventive concept, the second gate dielectric pattern GIb may have a varying thickness and an uneven upper surface.

For example, the second gate dielectric pattern GIb may include one or more of a silicon oxide layer, a silicon nitride layer, a silicon oxynitride layer, and/or a high-k dielectric layer. The high-k dielectric layer may include a material, such as hafnium oxide (HfO), aluminum oxide (AlO), or tantalum oxide (TaO), whose dielectric constant is greater than that of a silicon oxide layer. The second gate electrode GEb may include a conductive material. The second gate electrode GEb may include, for example, one or more of a doped semiconductor material, conductive metal nitride (e.g., titanium nitride or tantalum nitride), or metal (e.g., aluminum or tungsten). For example, second gate ohmic pattern 140b may include metal silicide.

Third gate spacers GSP3 may be disposed on and cover lateral surfaces of the second gate stack GSb. Fourth gate spacers GSP4 may be disposed on the lateral surfaces of the second gate stack GSb. Each of the third gate spacers GSP3 may be interposed between a corresponding one of the fourth gate spacers GSP4 and a corresponding lateral surface of the second gate stack GSb. The second gate dielectric pattern GIb may extend between each of the third gate spacers GSP3 and the substrate 100 (e.g., the second active pattern ACTb) and between each of the fourth gate spacers GSP4 and the substrate 100 (e.g., the second active pattern ACTb).

The third and fourth gate spacers GSP3 and GSP4 may include one or more of an oxide layer, a nitride layer, and/or an oxynitride layer. For example, the third and fourth gate spacers GSP3 and GSP4 may include one or more of a silicon oxide layer, a silicon nitride layer, and/or a silicon oxynitride layer. In an exemplary embodiment of the present inventive concept, the third gate spacers GSP3 may include the same material as that of the first gate spacers GSP1, and the fourth gate spacers GSP4 may include the same material as that of the second gate spacers GSP2.

Second impurity-doped regions IMb may be disposed in the substrate 100 on opposite sides of the second gate stack GSb. The second impurity-doped regions IMb may be placed in the second active pattern ACTb. A second transistor TRb may be configured to include the second gate stack GSb and the second impurity-doped regions IMb. The second impurity-doped regions IMb may include impurities doped therein. When the second transistor TRb is an NMOSFET, the impurities may be N-type impurities (e.g., phosphorous (P) or arsenic (As)). When the second transistor TRb is a PMOSFET, the impurities may be P-type impurities (e.g., boron (B)). In an exemplary embodiment of the present inventive concept, the second transistor TRb may constitute an analog circuit.

Second ohmic patterns 150b may be disposed on corresponding second impurity-doped regions IMb. The second ohmic patterns 150b may be in contact with the top surface 100U of the substrate 100 (e.g., top surfaces of the second impurity-doped regions IMb). For example, the second ohmic patterns 150b may include metal silicide.

A second gate contact 170b may be disposed on the second gate stack GSb. The second gate ohmic pattern 140b may be interposed between the second gate electrode GEb and the second gate contact 170b, and the second gate contact 170b may be connected to the second gate electrode GEb through the second gate ohmic pattern 140b. Second source/drain contacts 180b may be disposed on corresponding second ohmic patterns 150b. Each of the second ohmic patterns 150b may be interposed between a corresponding one of the second impurity-doped regions IMb and a corresponding one of the second source/drain contacts 180b. The second source/drain contacts 180b may be connected to the second impurity-doped regions IMb through the second ohmic patterns 150b. The second gate contact 170b and the second source/drain contacts 180b may include conductive metal nitride and/or metal. In an exemplary embodiment of the present inventive concept, the first gate contact 170a, the first source/drain contacts 180a, the second gate contact 170b, and the second source/drain contacts 180b may include the same material as each other. However, the present inventive concept is not limited thereto. For example, the first gate contact 170a and the first source/drain contacts 180a may include a different material from that of the second gate contact 170b and the second source/drain contacts 180b.

The second gate contact 170b and the second source/drain contacts 180b may each have a vertical length (or, e.g., a height) measured along the direction perpendicular to the top surface 100U of the substrate 100. Each of the second source/drain contacts 180b may have a height 180H2 greater than a height 170H2 of the second gate contact 170b. The second gate contact 170b and the second source/drain contacts 180b may each have a width measured along the direction parallel to the top surface 100U of the substrate 100. In an exemplary embodiment of the present inventive concept, each of the second source/drain contacts 180b may have a width 180W2 greater than a width 170W2 of the second gate contact 170b. In an exemplary embodiment of the present inventive concept, the width 180W2 of each of the second source/drain contacts 180b may be the same as or less than the width 170W2 of the second gate contact 170b.

The height 180H2 of each of the second source/drain contacts 180b may be greater than the height 180H1 of each of the first source/drain contacts 180a, and the width 180W2 of each of the second source/drain contacts 180b may be greater than the width 180W1 of each of the first source/drain contacts 180a. In an exemplary embodiment of the present inventive concept, the height 170H1 of the first gate contact 170a may be greater than the height 170H2 of the second gate contact 170b, and the width 170W1 of the first gate contact 170a may be greater than the width 170W2 of the second gate contact 170b.

A body contact 180c may be disposed on the third region Rc of the substrate 100. The body contact 180c may be placed on the third active pattern ACTc. A third ohmic pattern 150c may be interposed between the body contact 180c and the substrate 100 (e.g., the third active pattern ACTc). The body contact 180c may be connected to the substrate 100 through the third ohmic pattern 150c, and configured to apply a body bias to the substrate 100. For example, the body contact 180c may include conductive metal nitride and/or metal. In an exemplary embodiment of the present inventive concept, the body contact 180c may include the same material as that of the first gate contact 170a, the first source/drain contacts 180a, the second gate contact 170b, and the second source/drain contacts 180b. However, the present inventive concept is not limited thereto.

The body contact 180c may have a vertical length (or height) measured along the direction perpendicular to the top surface 100U of the substrate 100, and may also have a width measured along the direction parallel to the top surface 100U of the substrate 100. The body contact 180c may have a height 180H3 greater than the height 180H1 of each of the first source/drain contacts 180a, and may also have a width 180W3 greater than the width 180W1 of each of the first source/drain contacts 180a. In an exemplary embodiment of the present inventive concept, the height 180H3 and the width 180W3 of the body contact 180c may be substantially the same as the height 180H2 and the width 180W2 of each of the second source/drain contacts 180b. However, the present inventive concept is not limited thereto. For example, the height 180H3 and the width 180W3 of the body contact 180c may be less than the height 180H2 and the width 180W2 of each of the second source/drain contacts 180b.

The first source/drain contacts 180a may have top surfaces 180U1 at substantially the same level as that of top surfaces 180U2 of the second source/drain contacts 180b, and the body contact 180c may have a top surface 180U3 at substantially the same level as that f the top surfaces 180U1 and 180U2. The second source/drain contacts 180b may have bottom surfaces 180L2 at a lower level than that of bottom surfaces 180L1 of the first source/drain contacts 180a, and the body contact 180c may have a bottom surface 180L3 at a lower level than that of the bottom surfaces 180L1 of the first source/drain contacts 180a. The bottom surfaces 180L2 of the second source/drain contacts 180b may be at a same level as the bottom surface 180L3 of the body contact 180c. The first and second gate contacts 170a and 170b may have their respective top surfaces 170U1 and 170U2 at substantially the same level as that of the top surfaces 180U1, 180U2, and 180U3 of the first source/drain contact 180a, the second source/drain contact 180b, and the body contact 180c.

An interlayer dielectric layer 160 may be disposed on the substrate 100 and may cover the components mentioned above. The first and second gate contacts 170a and 170b may penetrate the interlayer dielectric layer 160 and may have a connection with the first and second gate ohmic patterns 140a and 140b, respectively. The first and second source/drain contacts 180a and 180b and the body contact 180c may penetrate the interlayer dielectric layer 160 and have a connection with the first, second, and third ohmic patterns 150a, 150b, and 150c, respectively. The interlayer dielectric layer 160 may include, for example, silicon oxide. Connection line patterns 200 may be disposed on the interlayer dielectric layer 160. The connection line patterns 200 may be located at substantially the same level from the top surface 100U of the substrate 100. The first and second gate contacts 170a and 170b, the first and second source/drain contacts 180a and 180b, and the body contact 180c may be connected to corresponding connection line patterns 200. For example, the connection line patterns 200 may include metal nitride and/or metal.

According to an exemplary embodiment of the present inventive concept, the widths 170W1, 170W2, 180W1, 180W2, and 180W3 of the first gate contact 170a, the second gate contact 170b, the first source/drain contact 180a, the second source/drain contact 180b, and the body contact 180c, respectively, may be varied in proportion to their vertical lengths (or the heights 170H1, 170H2, 180H1, 180H2, and 180H3). Therefore, an etching process on the interlayer dielectric layer 160 may be easily performed to form the first and second gate contacts 170a and 170b, the first and second source/drain contacts 180a and 180b, and the body contact 180c, so that it may be possible to form the first and second transistors TRa and TRb having different operating characteristics from each other on the substrate 100.

FIGS. 2 to 6 illustrate cross-sectional views showing a method of fabricating a semiconductor device according to an exemplary embodiment of the present inventive concept. Any repetitive description of the semiconductor device discussed with reference to FIG. 1 may be omitted.

Figure 2:
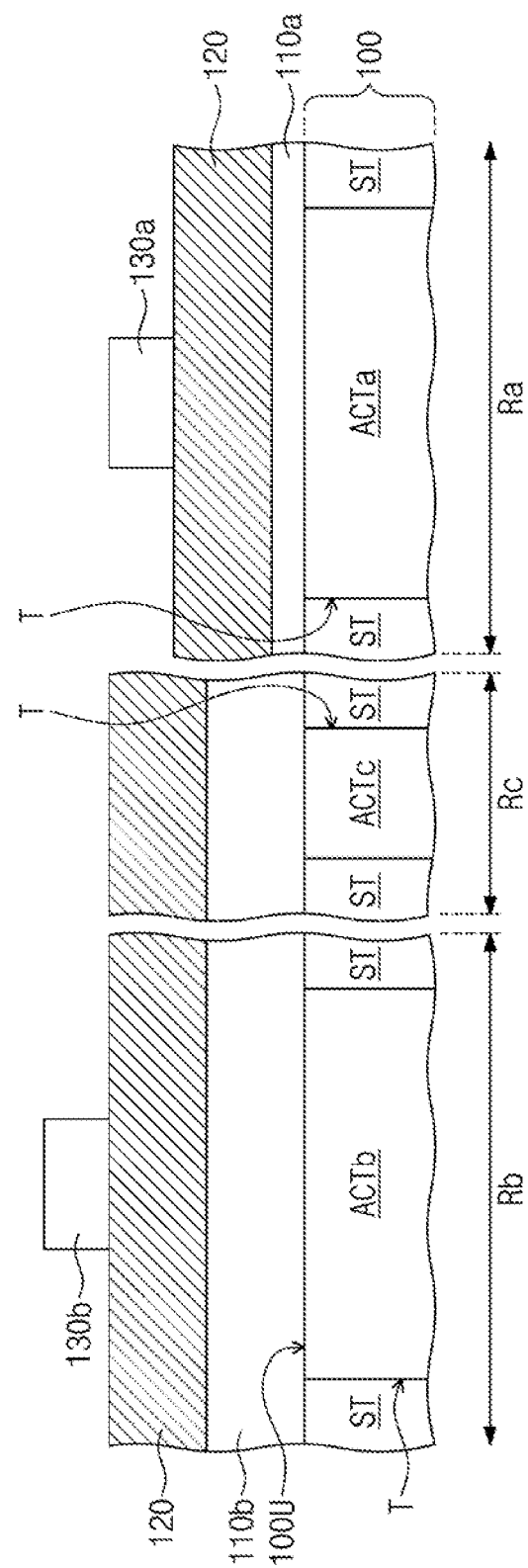
FIGS. 2, 3, 4, 5 and 6 illustrate cross-sectional views showing a method of fabricating a semiconductor device according to an exemplary embodiment of the present inventive concept.

Referring to FIG. 2, device isolation patterns ST may be formed in a substrate 100. The formation of the device isolation patterns ST may include, for example, patterning an upper portion of the substrate 100 to form trenches T for providing active patterns ACTa, ATCb, and ACTc. In addition, the formation of the device isolation patterns ST may further include, for example, forming on the substrate 100 a dielectric layer filling the trenches TR, and planarizing the dielectric layer until a top surface 100U of the substrate 100 is exposed. The substrate 100 may include a first region Ra, a second region Rb, and a third region Rc, and the active patterns ACTa, ACTb, and ACTc may include a first active pattern ACa on the first region Ra, a second active pattern ACTb on the second region Rb, and a third active pattern ACTc on the third region Rc.

A first gate dielectric layer 110a may be formed to cover the first region Ra of the substrate 100, and a second gate dielectric layer 110b may be formed to cover the second and third regions Rb and Rc of the substrate 100. The second gate dielectric layer 110b may be formed to have a thickness greater than that of the first gate dielectric layer 110a. For example, the second gate dielectric layer 110b may be formed to cover the first, second, and third regions Ra, Rb, and Rc of the substrate 100, and then the second gate dielectric layer 110b may be selectively removed from the first region Ra. Afterwards, the first gate dielectric layer 110a may be formed to cover the first region Ra. A gate electrode layer 120 may be formed to cover the first, second, and third regions Ra, Rb, and Rc of the substrate 100. A first mask pattern 130a may be formed on the first region Ra of the substrate 100, and a second mask pattern 130b may be formed on the second region Rb of the substrate 100. The first and second mask patterns 130a and 130b may include, for example, silicon oxide.

Figure 3:
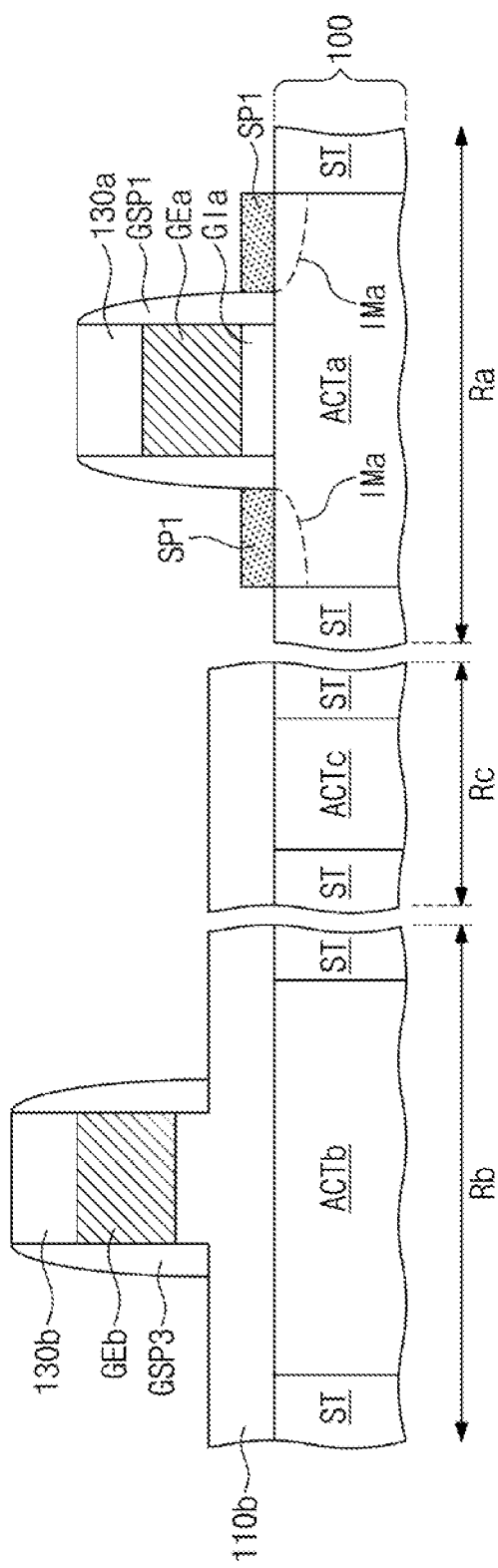

Referring to FIG. 3, the first and second mask patterns 130a and 130b may be used as an etching mask to etch the gate electrode layer 120. Thus, a first gate electrode GEa and a second gate electrode GEb may be respectively formed on the first region Ra and the second region Rb. In addition, the first and second mask patterns 130a and 130b may be used as an etching mask to etch the first and second gate dielectric layers 110a and 110b. The first gate dielectric layer 110a may be etched to form a first gate dielectric pattern GIa on the first region Ra. While the first gate dielectric pattern. GIa is formed, an upper portion of the second gate dielectric layer 110b may be etched. After the first gate dielectric pattern GIa is formed, a residue of the second gate dielectric layer 110b may remain on the second and third regions Rb and Rc.

First gate spacers GSP1 may be formed on lateral surfaces of the first gate electrode GEa, and third gate spacers GSP3 may be formed on lateral surfaces of the second gate electrode GEb. For example, the formation of the first and third gate spacers GSP1 and GSP3 may include forming on the substrate 100 a gate spacer layer to have a substantially uniform thickness, and performing an anisotropic etching process on the gate spacer layer. The anisotropic etching process may expose a top surface of the first active pattern ACTa on the first region Ra and also expose a top surface of the second gate dielectric layer 110b on the second and third regions Rb and Rc.

First impurity-doped regions IMa may be formed in the first active pattern ACTa on opposite sides of the first gate electrode GEa. The first impurity-doped regions IMa may be formed by implanting P-type or N-type impurities into the first active pattern ACTa. The first impurity-doped regions IMa may be formed by using, for example, an ion implantation process. Thereafter, a first semiconductor pattern SP1 may be formed on each of the first impurity-doped regions IMa. The first semiconductor pattern SP1 may be formed by, for example, a selective epitaxial growth process in which the substrate 100 (e.g., the first active pattern ACTa) is used as a seed.

Figure 4:
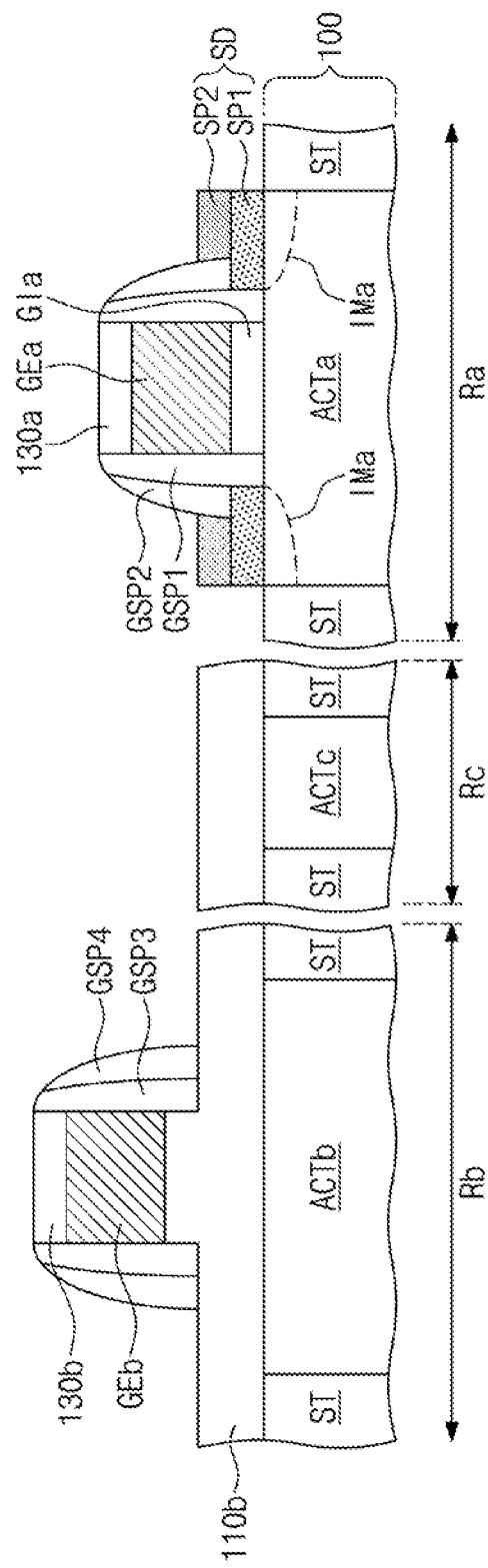

Referring to FIG. 4, after the first semiconductor pattern SP1 is formed, second gate spacers GSP2 may be formed on the lateral surfaces of the first gate electrode GEa. In addition, fourth gate spacers GSP4 may be formed on the lateral surfaces of the second gate electrode GEb. The first gate spacers GSP1 may be interposed between the second gate spacers GSP2 and tile lateral surfaces of the first gate electrode GEa, and the third gate spacers GSP3 may be interposed between the fourth gate spacers GSP4 and the lateral surfaces of the second gate electrode GEb. For example, the formation of the second and fourth gate spacers GSP2 and GSP4 may include forming on the substrate 100 an additional gate spacer layer to have a substantially uniform thickness, and performing an anisotropic etching process on the additional gate spacer layer. The anisotropic etching process may expose a top surface of the first semiconductor pattern SP1 on the first region Ra and also expose the top surface of the second gate dielectric layer 110b on the second and third regions Rb and Rc. After that, a second semiconductor pattern SP2 may be formed on the first semiconductor pattern SP1. The second semiconductor pattern SP2 may be formed by, for example, a selective epitaxial growth process in which the first semiconductor pattern SP1 is used as a seed. During or after the selective epitaxial growth processes for the formation of the first and second semiconductor patterns SP1 and SP2, P-type or N-type impurities may be doped into the first and second semiconductor patterns SP1 and SP2. The first semiconductor pattern SP1 and the second semiconductor pattern SP2 may constitute a source/drain pattern SD. A pair of source/drain patterns SD may be correspondingly formed on the first impurity-doped regions IMa.

Figure 5:
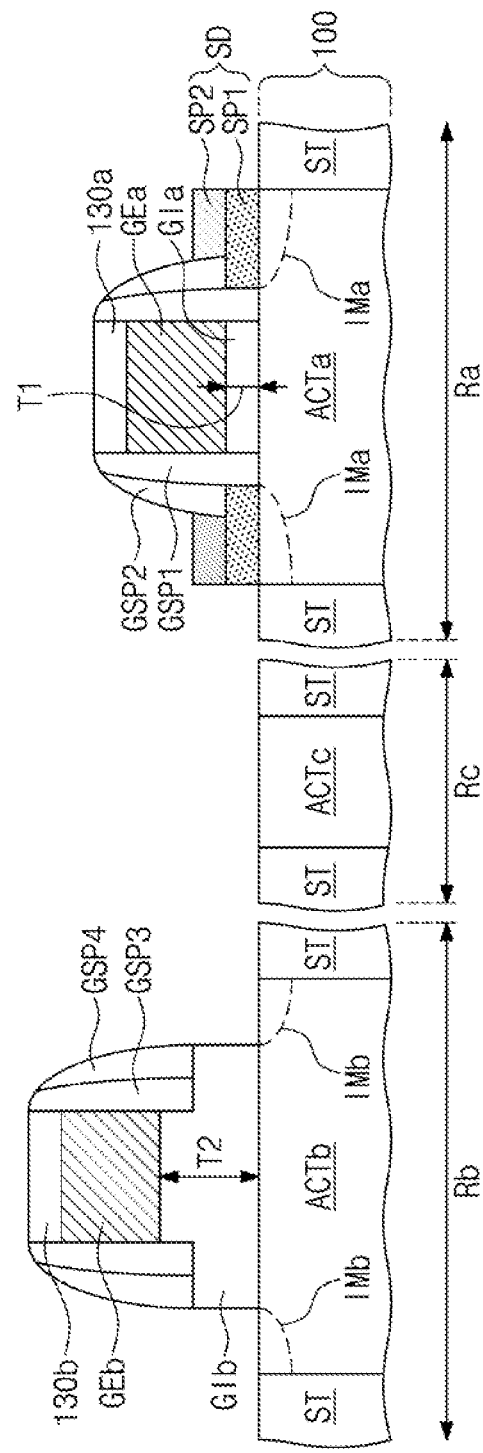

Referring to FIG. 5, the residue of the second gate dielectric layer 110b may be etched to form a second gate dielectric pattern GIb on the second region Rb. The formation of the second gate dielectric pattern GIb may include, for example, using the second mask pattern 130b and the third and fourth gate spacers GSP3 and GSP4 as an etching mask to etch the residue of the second gate dielectric layer 110b. For example, while the second gate dielectric pattern GIb is formed, an additional mask pattern may be provided on the first region Ra to protect the first mask pattern 130a, the first and second gate spacers GSP1 and GSP2, and the source/drain pattern SD, but the present inventive concept is not limited thereto. The second gate dielectric pattern GIb may have a thickness T2 greater than a thickness T1 of the first gate dielectric pattern GIa. While the second gate dielectric pattern GIb is formed, the residue of the second gate dielectric layer 110b may be removed from the third region Rc, and thus the third active pattern ACTc may be exposed on the third region Rc.

Second impurity-doped regions IMb may be formed in the second active pattern ACTb on opposite sides of the second gate electrode GEb. The second impurity-doped regions IMb may be formed by implanting P-type or N-type impurities into the second active pattern ACTb. The second impurity-doped regions IMb may be formed by using, for example, an ion implantation process.

Figure 6:
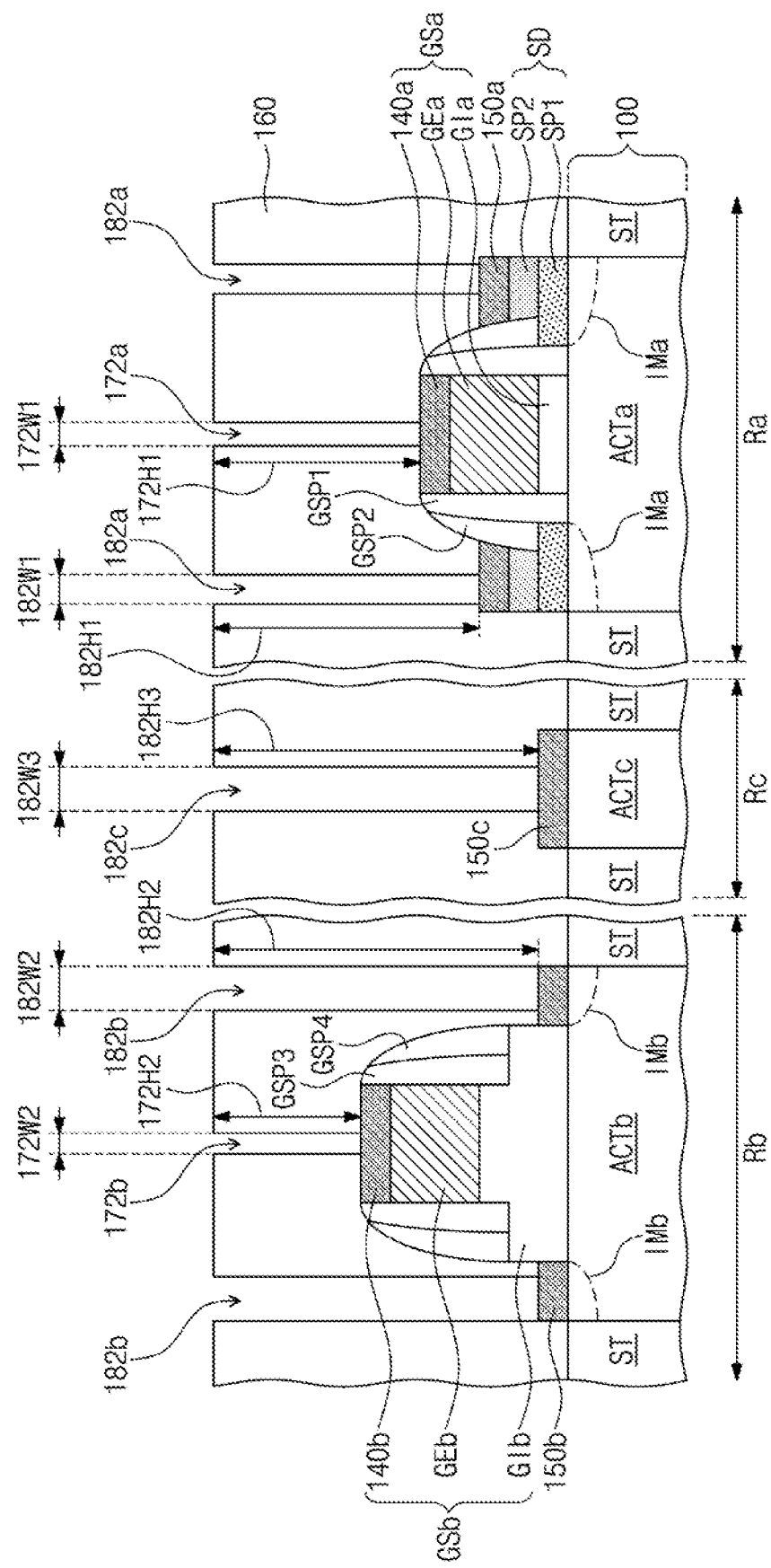

Referring to FIG. 6, the first and second mask patterns 130a and 130b may be selectively removed. Thereafter, a first gate ohmic pattern 140a and a second gate ohmic pattern 140b may be respectively formed on the first gate electrode GEa and the second gate electrode GEb. First ohmic patterns 150a may be formed on corresponding source/drain patterns SD, and second ohmic patterns 150b may be formed on corresponding second impurity-doped regions IMb. A third ohmic pattern 150c may be formed on a top surface of the third active pattern ACTc. For example, the formation of the first and second gate ohmic patterns 140a and 140b and the first, second, and third ohmic patterns 150a, 150b, and 150c may include forming a metal layer on the substrate 100, performing an annealing process to form a silicide layer, and removing the metal layer which has not reacted.

An interlayer dielectric layer 160 may be formed to cover the structures formed on the substrate 100. A first gate contact hole 172a and first source/drain contact holes 182a may be formed in the interlayer dielectric layer 160 on the first region Ra, and a second gate contact hole 172b and second source/drain contact holes 182b may be formed in the interlayer dielectric layer 160 on the second region Rb. A body contact hole 182c may be formed in the interlayer dielectric layer 160 on the third region Rc. The first gate contact hole 172a may penetrate the interlayer dielectric layer 160 and expose the first gate ohmic pattern 140a, and the first source/drain contact holes 182a may penetrate the interlayer dielectric layer 160 and correspondingly expose the first ohmic patterns 150a. The second gate contact hole 172b may penetrate the interlayer dielectric layer 160 and expose the second gate ohmic pattern 140b, and the second source/drain contact holes 182b may penetrate the interlayer dielectric layer 160 and correspondingly expose the second ohmic patterns 150b. The body contact hole 182c may penetrate the interlayer dielectric layer 160 and expose the third ohmic pattern 150c.

Each of the first source/drain contact holes 182a may have a height 182H1 greater than a height 172H1 of the first gate contact hole 172a. In an exemplary embodiment of the present inventive concept, each of the first source/drain contact holes 182a may have a width 182W1 greater than a width 172W1 of the first gate contact hole 172a. In an exemplary embodiment of the present inventive concept, the width 182W1 of each of the first source/drain contact holes 182a may be the same as or less than the width 172W1 of the first gate contact hole 172a. Each of the second source/drain contact holes 182b may have a height 182H2 greater than a height 172H2 of the second gate contact hole 172b. In an exemplary embodiment of the present inventive concept, each of the second source/drain contact holes 182b may have a width 182W2 greater than a width 172W2 of the second gate contact hole 172b. In an exemplary embodiment of the present inventive concept, the width 182W2 of each of the second source/drain contact holes 182b may be the same as or less than the width 172W2 of the second gate contact hole 172b.

The height 182H2 of each of the second source/drain contact holes 182b may be greater than the height 182H1 of each of the first source/drain contact holes 182a, and the width 182W2 of each of the second source/drain contact holes 182b may be greater than the width 182W1 of each of the first source/drain contact holes 182a. In an exemplary embodiment of the present inventive concept, the height 172H1 of the first gate contact hole 172a may be greater than the height 172H2 of the second gate contact hole 172b, and the width 172W1 of the first gate contact hole 172a may be greater than the width 172W2 of the second gate contact hole 172b.

The body contact hole 182c may have a height 182H3 greater than the height 182H1 of each of the first source/drain contact holes 182a, and also have a width 182W3 greater than the width 182W1 of each of the first source/drain contact holes 182a. In an exemplary embodiment of the present inventive concept, the height 182H3 and the width 182W3 of the body contact hole 182c may be substantially the same as the height 182H2 and the width 182W2 of each of the second source/drain contact holes 182b.

According to an exemplary embodiment of the present inventive concept, the widths 172W1, 172W2, 182W1, 182W2, and 182W3 of the first gate contact hole 172a, the second gate contact hole 172b, the first source/drain contact hole 182a, the second source/drain contact hole 182b, and the body contact hole 182c may increase in proportion to their vertical lengths (or the heights 172H1, 172H2, 182H1, 182H2, and 182H3), Therefore, an etching process on the interlayer dielectric layer 160 may be easily performed to form the first and second gate contact holes 172a and 172b, the first and second source/drain contact holes 182a and 182b, and the body contact hole 182c.

Referring back to FIG. 1, first and second gate contacts 170a and 170b may be respectively formed in the first and second gate contact holes 172a and 172b, first and second source/drain contacts 180a and 180b may be respectively formed in the first and second source/drain contact holes 182a and 182b, and a body contact 180c may be formed in the body contact hole 182c. For example, the formation of the first and second gate contacts 170a and 170b, the first and second source/drain contacts 180a and 180b, and the body contact 180c may include forming on the interlayer dielectric layer 160 a conductive layer filling the first and second gate contact holes 172a and 172b, the first and second source/drain contact holes 182a and 182b, and the body contact hole 182c, and planarizing the conductive layer until the interlayer dielectric layer 160 is exposed. After that, connection line patterns 200 may be formed on the interlayer dielectric layer 160. For example, the formation of the connection line patterns 200 may include forming a conductive layer on the interlayer dielectric layer 160 and patterning the conductive layer.

Figure 7:
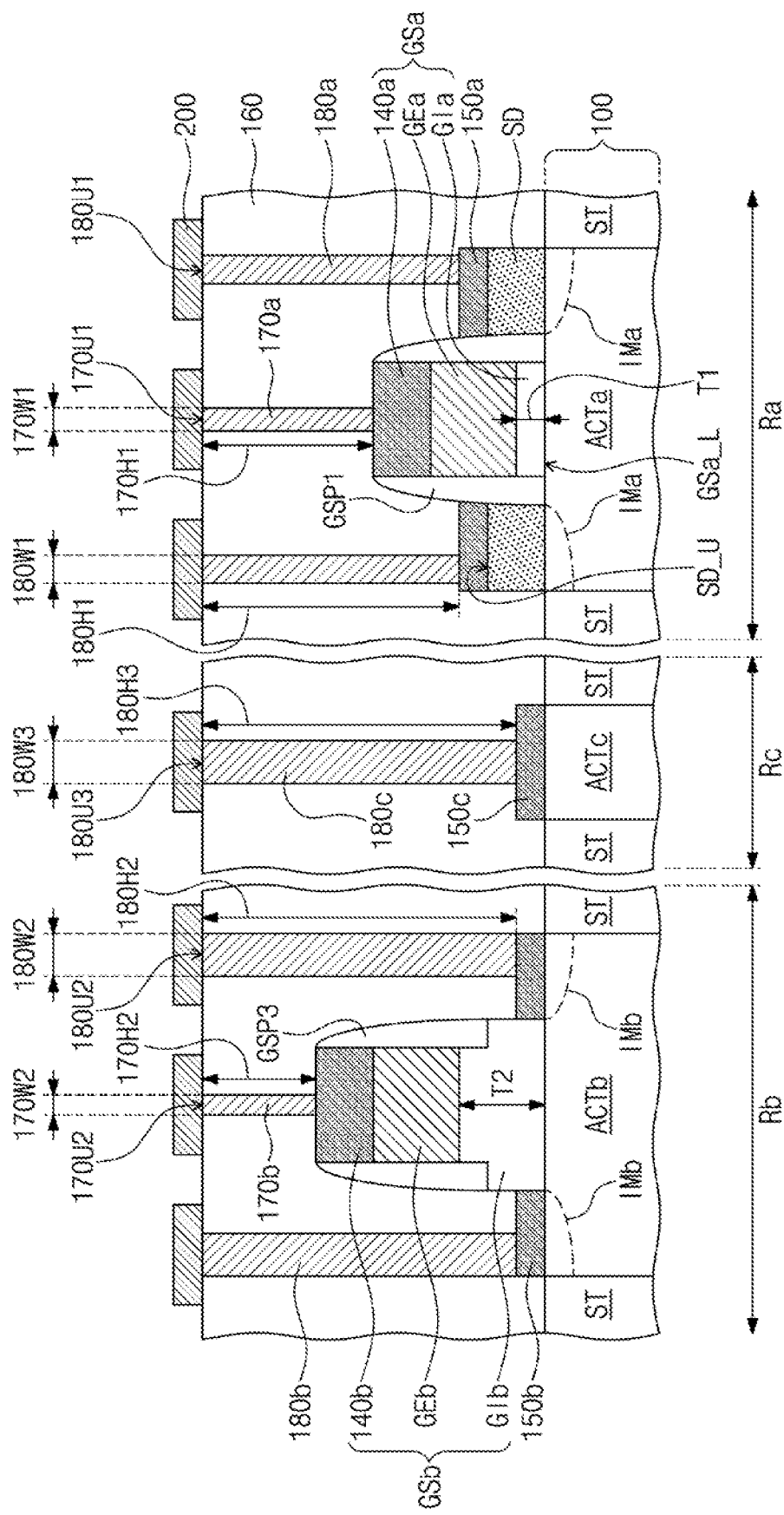
FIG. 7 illustrates a cross-sectional view showing a semiconductor device according to an exemplary embodiment of the present inventive concept.

FIG. 7 illustrates a cross-sectional view showing a semiconductor device according to an exemplary embodiment of the present inventive concept. The following will describe differences from the semiconductor device discussed with reference to FIG. 1.

Referring to FIG. 7, the first gate spacers GSP1 may be disposed on and cover lateral surfaces of the first gate stack GSa. For example, each first gate spacer GSP1 is disposed at opposite sides of the first gate stack GSa. In an exemplary embodiment of the present inventive concept, the second gate spacers GSP2 may be omitted. The source/drain patterns SD may be disposed on the substrate 100 on opposite sides of the first gate stack GSa. Each of the source/drain patterns SI) may be spaced apart from the first gate stack GSa by a corresponding one of the first gate spacers GSP1. The corresponding first gate spacer GSP1 may be interposed between the first gate stack GSa and the each of the source/drain patterns SD. In an exemplary embodiment of the present inventive concept, each of the source/drain patterns SD may be a single-layered semiconductor pattern. For example, the semiconductor pattern may include one or more of silicon (Si), silicon carbide (SiC), and silicon-germanium (SiGe).

The third gate spacers GSP3 may be disposed on and cover lateral surfaces of the second gate stack GSb. For example, each third gate spacer GSP3 is disposed at opposite sides of the second gate stack GSb. In an exemplary embodiment of the present inventive concept, the fourth gate spacers GSP4 may be omitted. The second gate dielectric pattern. GIb may extend between each of the third gate spacers GSP3 and the substrate 100 (e.g., the second active pattern ACTb). Except for the mentioned above description, a semiconductor device according to the present embodiment is substantially the same as the semiconductor device discussed with reference to FIG. 1.

Figure 8:
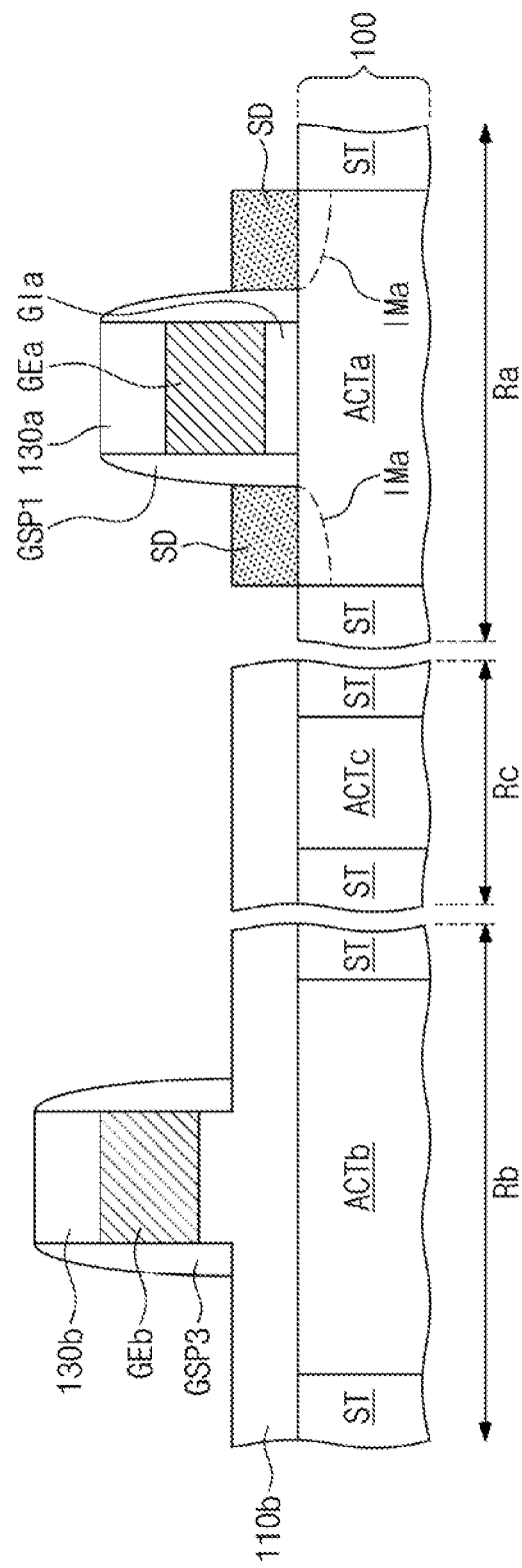
FIGS. 8, 9 and 10 illustrate cross-sectional views showing a method of fabricating a semiconductor device according to an exemplary embodiment of the present inventive concept.
Figure 9:
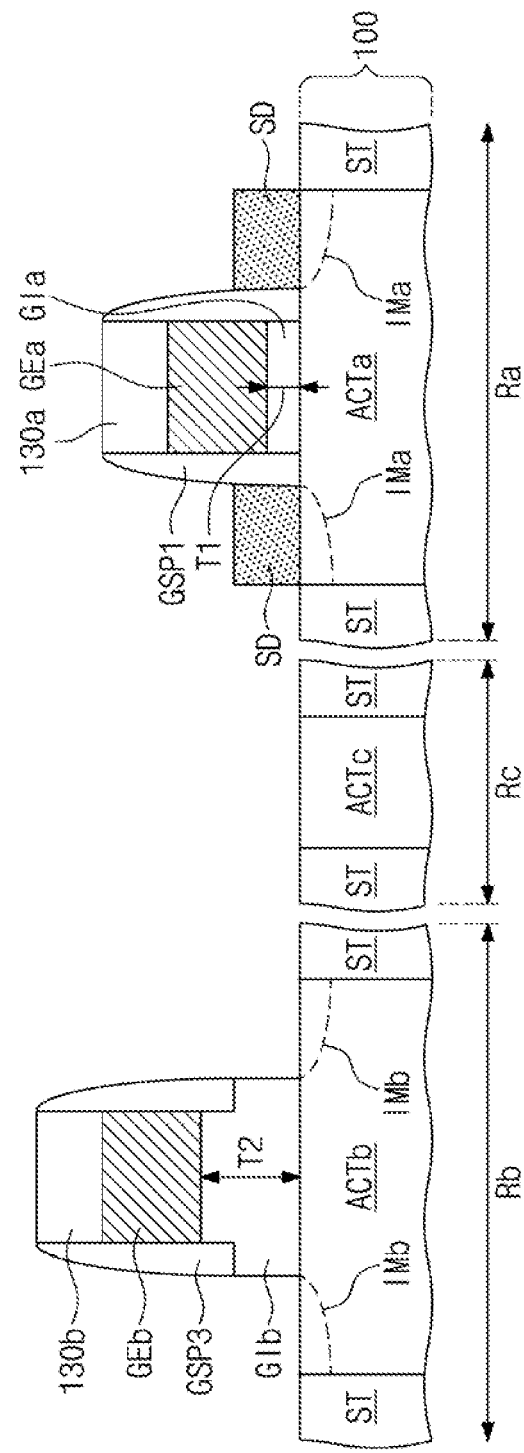
Figure 10:
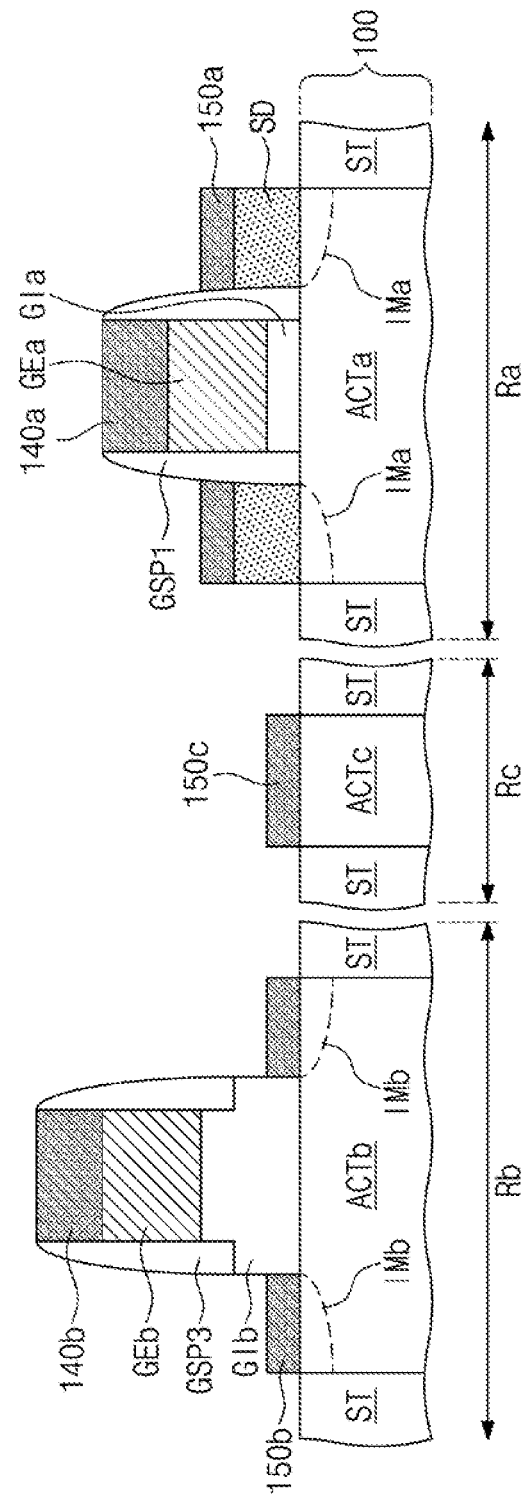

FIGS. 8 to 10 illustrate cross-sectional views showing a method of fabricating a semiconductor device according to an exemplary embodiment of the present inventive concept. The following will mainly describe differences from the semiconductor device fabrication method discussed with reference to FIGS. 2 to 6.

Referring to FIG. 8, the first gate spacers GSM may be formed on lateral surfaces of the first gate electrode GEa, and the third gate spacers GSP3 may be formed on lateral surfaces of the second gate electrode GEb. The first impurity-doped regions IMa may be formed in the first active pattern ACTa on opposite sides of the first gate electrode GEa. Thereafter, a single-layered semiconductor pattern SP may be formed on each of the first impurity-doped regions IMa. The semiconductor pattern SP may be formed by, for example, a selective epitaxial growth process in which the substrate 100 (e.g., the first active pattern ACTa) is used as a seed. During or after the selective epitaxial growth process, the semiconductor pattern. SP may be doped with P-type or N-type impurities. The semiconductor pattern SP may constitute the source/drain pattern SD, A pair of source/drain patterns SD may be correspondingly formed on the first impurity-doped regions IMa.

Referring to FIG. 9, the residue of the second gate dielectric layer 110b (see FIG. 8) may be etched to form the second gate dielectric pattern GIb on the second region Rb. The formation of the second gate dielectric pattern GIb may include, for example, using the second mask pattern 130b and the third gate spacers GSP3 as an etching mask to etch the residue of the second gate dielectric layer 110b. While the second gate dielectric pattern GIb is formed, the residue of the second gate dielectric layer 110b may be removed from the third region Rc, and thus the third active pattern ACTc may be exposed on the third region Rc. Thereafter, the second impurity-doped regions IMb may be formed in the second active pattern ACTb on opposite sides of the second gate electrode GEb.

Referring to FIG. 10, the first and second mask patterns 130a and 130b (see FIG. 9) may be selectively removed. Thereafter, the first gate ohmic pattern 140a and the second gate ohmic pattern 140b may be respectively formed on the first gate electrode GEa and the second gate electrode GEb. The first ohmic patterns 150a may be formed on corresponding source/drain patterns SD, and the second ohmic patterns 150b may be formed on corresponding second impurity-doped regions IMb. The third ohmic pattern 150c may be formed on the third active pattern ACTc. For example, the third ohmic pattern 150c may be formed on a top surface of the third active pattern ACTc. The first and second gate ohmic patterns 140a and 140b and the first, second, and third ohmic patterns 150a, 150b, and 150c may be formed by using substantially the same method discussed with reference to FIG. 6. Except for the mentioned above description, a semiconductor device fabrication method according to the present embodiment is substantially the same as the semiconductor device fabrication method discussed with reference to FIGS. 2 to 6.

Figure 11:
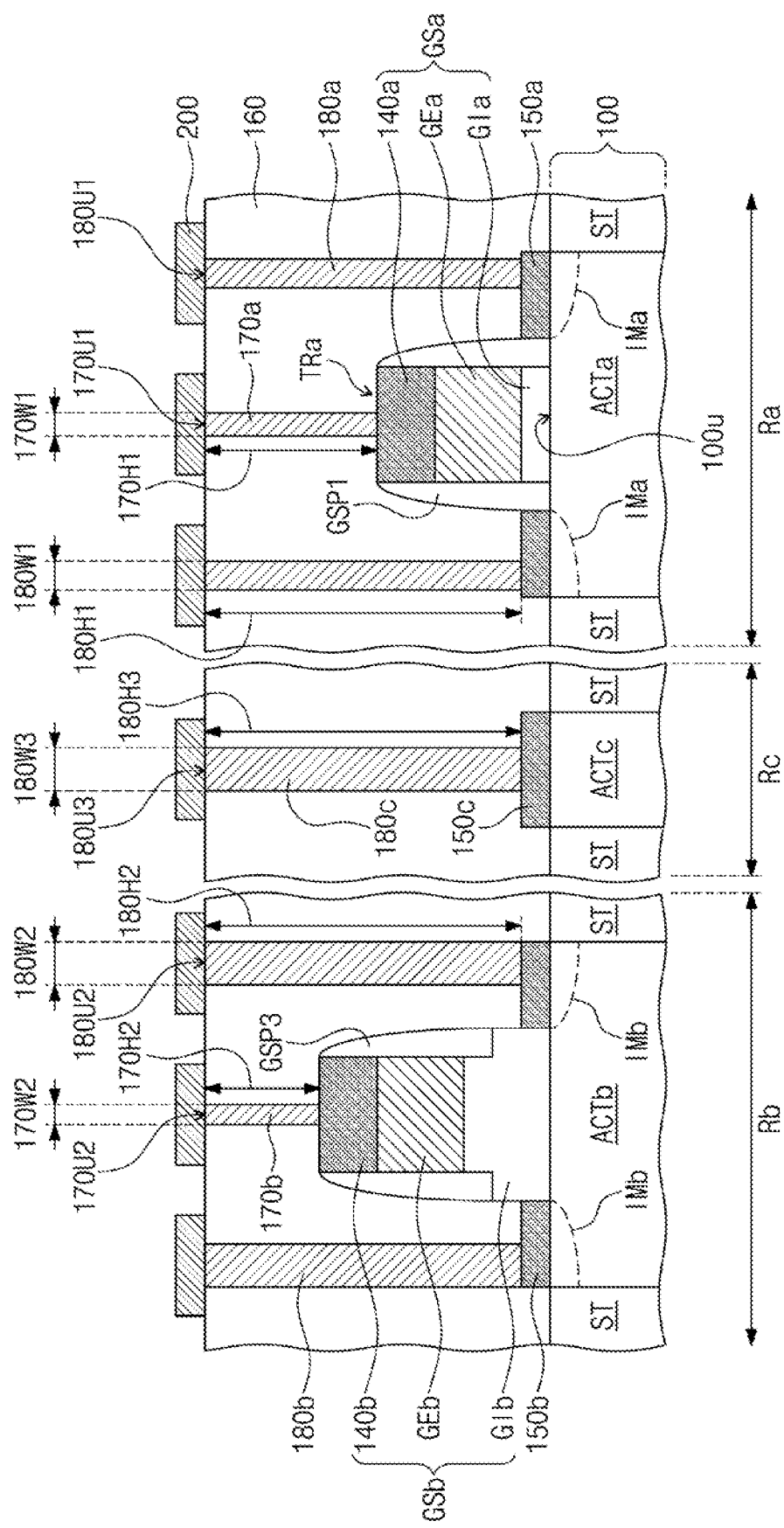
FIG. 11 illustrates a cross-sectional view showing a semiconductor device according to an exemplary embodiment of the present inventive concept.

FIG. 11 illustrates a cross-sectional view showing a semiconductor device according to an exemplary embodiment of the present inventive concept. The following will describe differences from the semiconductor device discussed with reference to FIG. 1.

Referring to FIG. 11, the first gate spacers GSP1 may be disposed on and cover lateral surfaces of the first gate stack GSa. In an exemplary embodiment of the present inventive concept, neither the second gate spacers GSP2 nor the source/drain patterns SD may be formed. The first impurity-doped regions IMa may be disposed in the substrate 100 on opposite sides of the first gate stack GSa, and the first transistor TRa may be configured to include the first gate stack GSa and the first impurity-doped regions IMa. The first ohmic patterns 150a may be disposed on corresponding first impurity-doped regions IMa, and may contact the substrate 100. For example, the first ohmic patterns 150a may contact the top surface 100U of the substrate 100 (e.g., top surfaces of the first impurity-doped regions IMa).

The first source/drain contacts 180a may be disposed on corresponding first ohmic patterns 150a. Each of the first ohmic patterns 150a may be interposed between a corresponding one of the first impurity-doped regions IMa and a corresponding one of the first source/drain contacts 180a. In addition, each of the first source/drain contacts 180a may be connected to the corresponding one of the first impurity-doped regions IMa through the corresponding one of the first ohmic patterns 150a.

The third gate spacers GSP3 may be disposed on and cover lateral surfaces of the second gate stack GSb. In an exemplary embodiment of the present inventive concept, the formation of the fourth gate spacers GSP4 may be omitted. The second gate dielectric pattern GIb may extend between each of the third gate spacers GSP3 and the substrate 100 (e.g., the second active pattern ACTb).

In an exemplary embodiment of the present inventive concept, the height 180H1 of each of the first source/drain contacts 180a may be substantially the same as the height 180H2 of each of the second source/drain contacts 180b, and the width 180W1 of each of the first source/drain contacts 180a may be substantially the same as the width 180W2 of each of the second source/drain contacts 180b. The height 180H3 of the body contact 180c may be substantially the same as the height 180H1 of each of the first source/drain contacts 180a, and the width 180W3 of the body contact 180c may be substantially the same as the width 180W1 of each of the first source/drain contacts 180a. Except for the mentioned above description, a semiconductor device according to the present embodiment is substantially the same as the semiconductor device discussed with reference to FIG. 1.

Figure 12:
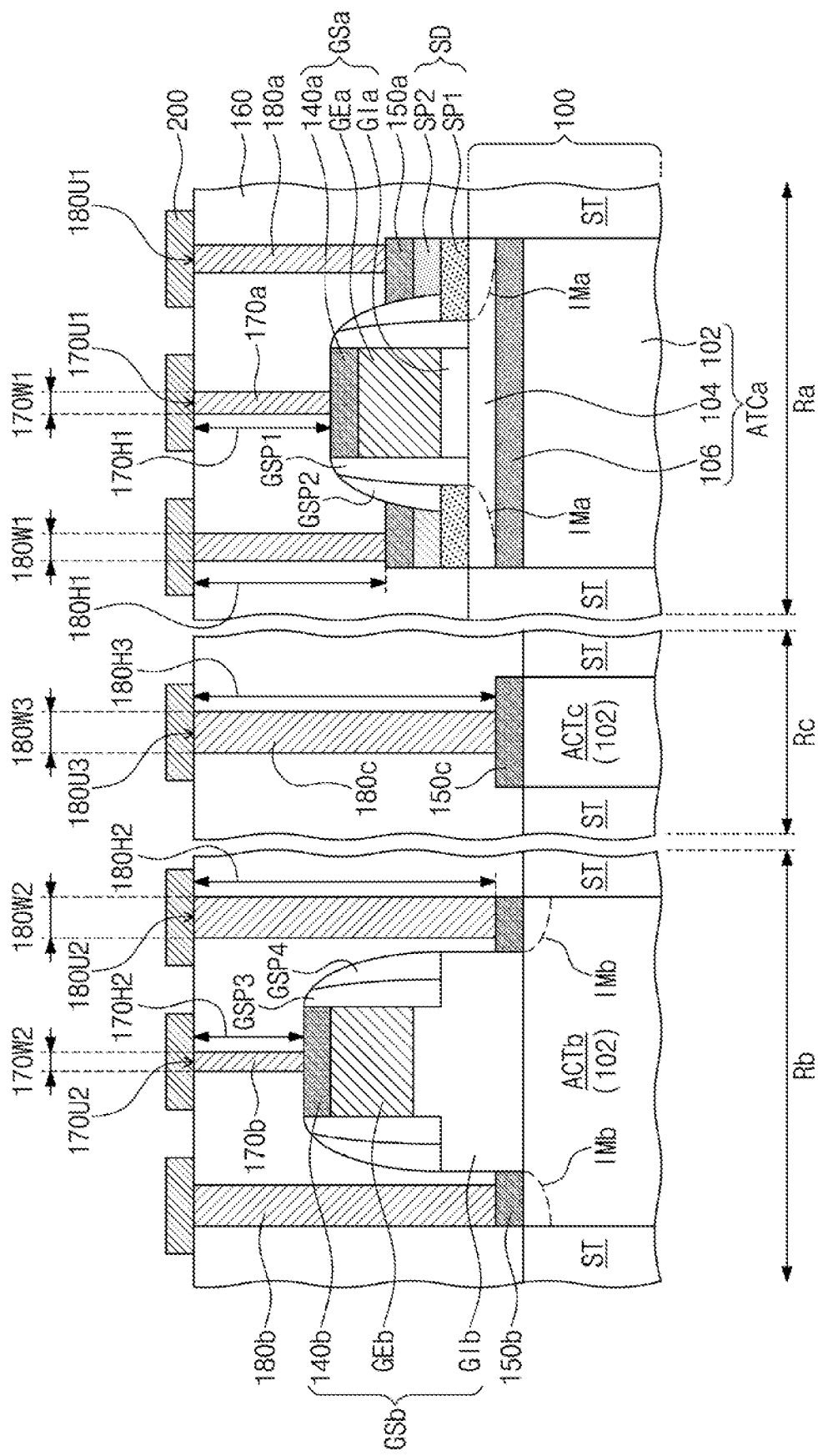
FIG. 12 illustrates a cross-sectional view showing a semiconductor device according to an exemplary embodiment of the present inventive concept.

FIG. 12 illustrates a cross-sectional view showing a semiconductor device according to an exemplary embodiment of the present inventive concept. The following will describe differences from the semiconductor device discussed with reference to FIG. 1.

Referring to FIG. 12, the substrate 100 may be a silicon-on-insulator (SOI) substrate including a lower semiconductor layer 102, an upper semiconductor layer 104, and an insulating layer 106 between the lower and upper semiconductor layers 102 and 104. The first region Ra may be an SOI substrate part including the lower semiconductor layer 102, the upper semiconductor layer 104, and the insulating layer 106, and the second and third regions Rb and Rc may be a bulk silicon substrate part where the upper semiconductor layer 104 and the insulating layer 106 are removed. The upper semiconductor layer 104 and the insulating layer 106 may be locally provided on the first region Ra. The first active pattern ACTa on the first region Ra may include the lower semiconductor layer 102, the upper semiconductor layer 104, and the insulating layer 106, and the second and third active patterns ACTb and ACTc respectively on the second and third regions Rb and Rc may include the lower semiconductor layer 102 and might not include the upper semiconductor layer 104 and the insulating layer 106.

The first gate stack GSa may be disposed on the upper semiconductor layer 104 of the first region Ra. The first gate dielectric pattern GIa may be interposed between the upper semiconductor layer 104 and the first gate electrode GEa, and the first gate ohmic pattern 140a may be disposed on the first gate electrode GEa.

The source/drain patterns SD may be disposed on the upper semiconductor layer 104 on opposite sides of the first gate stack GSa. In an exemplary embodiment of the present inventive concept, each of the source/drain patterns SD may include the first semiconductor pattern SP1 and the second semiconductor pattern SP2 that are sequentially stacked on the upper semiconductor layer 104. The first semiconductor pattern SP1 may extend between the corresponding second gate spacer GSP2 and the upper semiconductor layer 104, and may contact the corresponding first gate spacer GSP1. The second semiconductor pattern SP2 may be spaced apart from the corresponding first gate spacer GSP1 by the corresponding second gate spacer GSP2. The corresponding second gate spacer GSP2 may be interposed between the corresponding first gate spacer GSP1 and the second semiconductor pattern SP2.

The first impurity-doped regions IMa may be disposed in the upper semiconductor layer 104 on opposite sides of the first gate stack GSa. The source/drain patterns SD may be disposed on and connected to corresponding first impurity-doped regions IMa. The insulating layer 106 may separate the first impurity-doped regions IMa from the lower semiconductor layer 102. The first source/drain contacts 180a may be disposed on corresponding source/drain patterns SD, and may be connected to the source/drain patterns SD through the first ohmic patterns 150a. The first source/drain contacts 180a may be connected to the first impurity-doped regions IMa in the upper semiconductor layer 104 through the source/drain patterns SD.

The second gate stack GSb may be disposed on the lower semiconductor layer 102 of the second region Rb. The second gate dielectric pattern. GIb may be interposed between the lower semiconductor layer 102 and the second gate electrode GEb, and the second gate ohmic pattern 140b may be disposed on the second gate electrode GEb. The second gate dielectric pattern GIb may extend between each of the third gate spacers GSP3 and the lower semiconductor layer 102 and between each of the fourth gate spacers GSP4 and the lower semiconductor layer 102.

The second impurity-doped regions IMb may be disposed in the lower semiconductor layer 102 on opposite sides of the second gate stack GSb. The second ohmic patterns 150b may be disposed on corresponding second impurity-doped regions IMb, and contact the lower semiconductor layer 102. The second source/drain contacts 180b may be disposed on corresponding second ohmic patterns 150b, and may be connected to the second impurity-doped regions IMb in the lower semiconductor layer 102 through the second ohmic patterns 150b.

The body contact 180c may be disposed on the lower semiconductor layer 102 of the third region Rc. The third ohmic pattern 150c may be interposed between the body contact 180c and the lower semiconductor layer 102, and may contact the lower semiconductor layer 102. The body contact 180c may be connected to the lower semiconductor layer 102 through the third ohmic pattern 150c, and may be configured to apply a body bias to the lower semiconductor layer 102. Except for the mentioned above description, a semiconductor device according to the present embodiment is substantially the same as the semiconductor device discussed with reference to FIG. 1.

FIGS. 13 to 18 illustrate cross-sectional views showing a method of fabricating a semiconductor device according to an exemplary embodiment the present inventive concept. The following will describe differences from the semiconductor device fabrication method discussed with reference to FIGS. 2 to 6.

Figure 13:
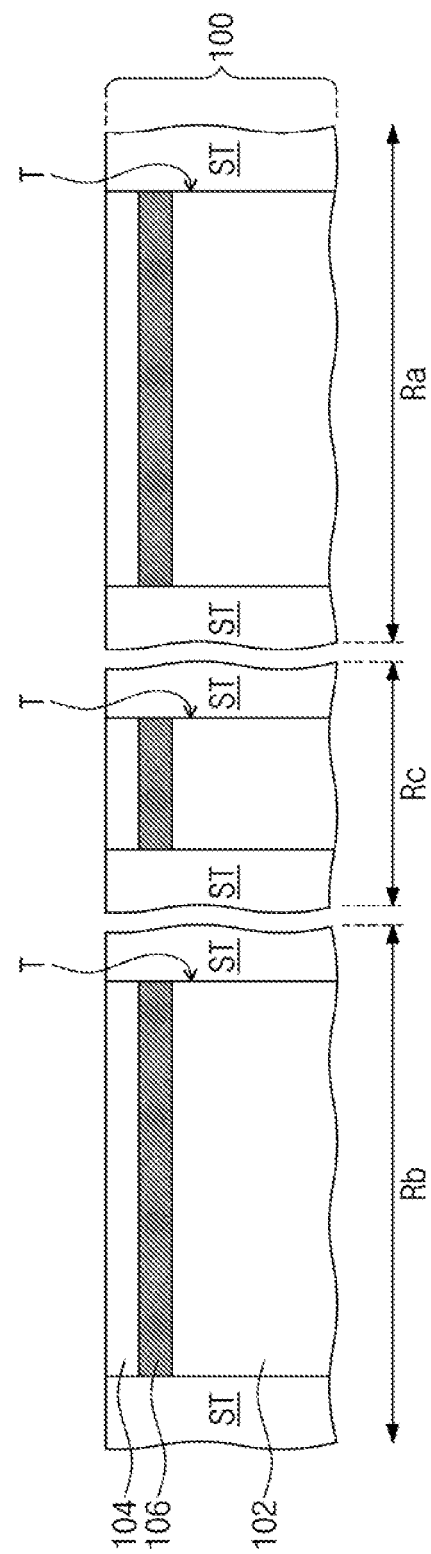
FIGS. 13, 14, 15, 16, 17 and 18 illustrate cross-sectional views showing a method of fabricating a semiconductor device according to an exemplary embodiment of the present inventive concept.

Referring to FIG. 13, device isolation patterns ST may be formed in a substrate 100. The substrate 100 may be a silicon-on-insulator (SOI) substrate including a lower semiconductor layer 102, an upper semiconductor layer 104, and an insulating layer 106 between the lower and upper semiconductor layers 102 and 104. The formation of the device isolation patterns ST may include etching an upper portion of the substrate 100 to form trenches T, forming on the substrate 100 a dielectric layer filling the trenches T, and planarizing the dielectric layer until a top surface of the upper semiconductor layer 104 is exposed. The substrate 100 may include a first region Ra, a second region Rb, and a third region Rc.

Figure 14:
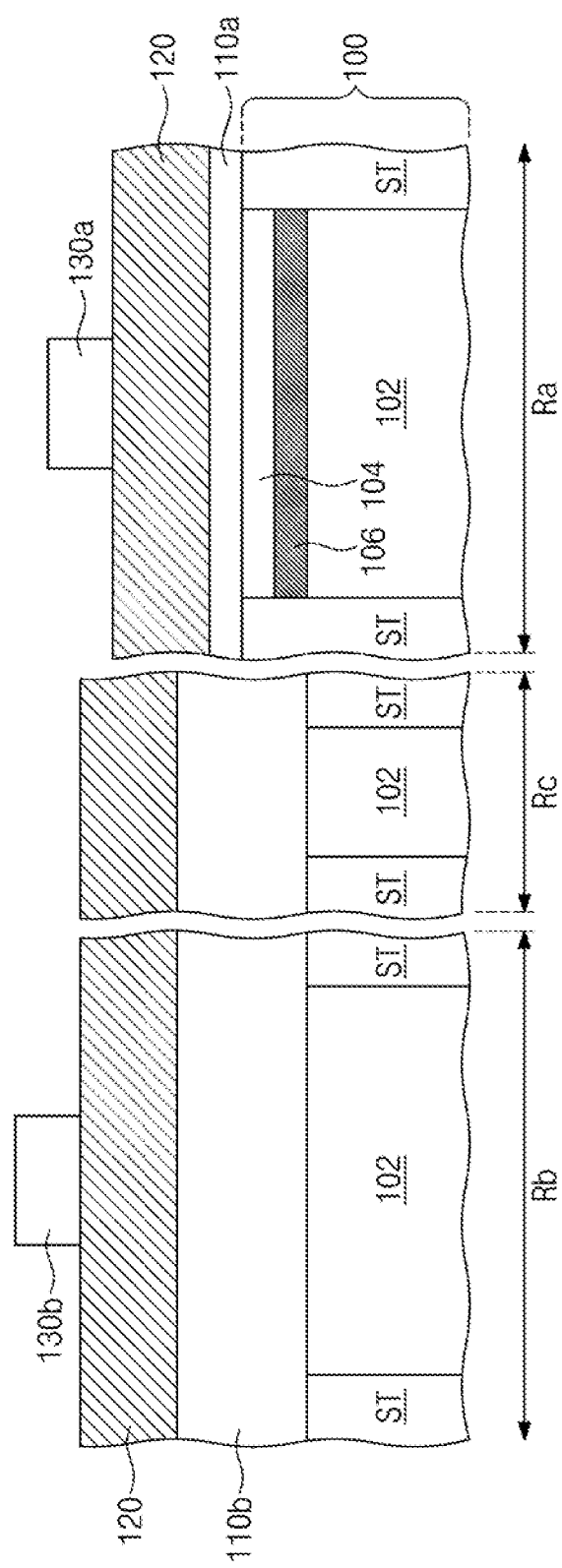

Referring to FIG. 14, the upper semiconductor layer 104 and the insulating layer 106 may be removed from the second and third regions Rb and Rc of the substrate 100. Thus, the upper semiconductor layer 104 and the insulating layer 106 may be locally provided on the first region Ra. During the removal of the upper semiconductor layer 104 and the insulating layer 106, upper portions of the device isolation patterns ST may also be removed from the second and third regions Rb and Rc of the substrate 100.

A first gate dielectric layer 110a may be formed to cover the upper semiconductor layer 104 of the first region Ra, and a second gate dielectric layer 110b may be formed to cover the lower semiconductor layer 102 of the second and third regions Rb and Rc. The second gate dielectric layer 110b may be formed to have a thickness greater than that of the first gate dielectric layer 110a. A gate electrode layer 120 may be formed to cover the first, second, and third regions Ra, Rb, and Rc of the substrate 100. A first mask pattern 130a may be formed on the first region Ra of the substrate 100, and a second mask pattern 130b may be formed on the second region Rb of the substrate 100.

Figure 15:
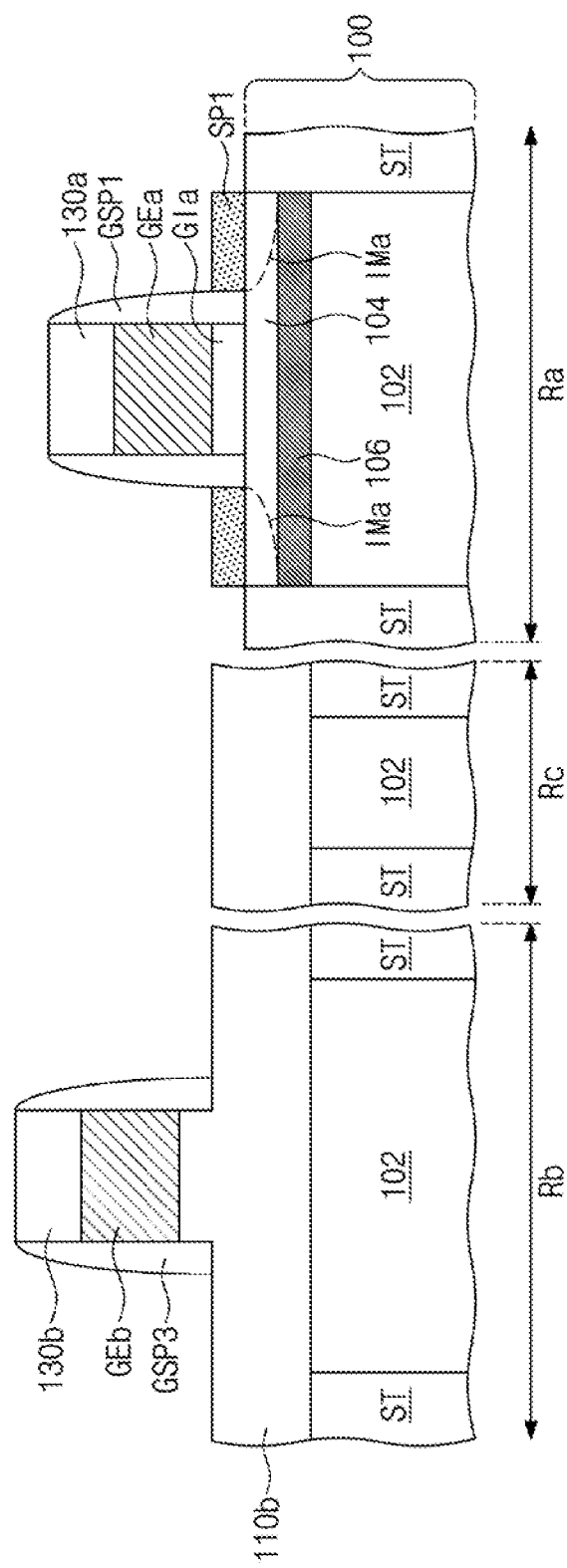

Referring to FIG. 15, the first and second mask patterns 130a and 130b may be used as an etching mask to etch the gate electrode layer 120. Therefore, a first gate electrode GEa and a second gate electrode GEb may be respectively formed on the first region Ra and the second region Rb. In addition, the first and second mask patterns 130a and 130b may be used as an etching mask to etch the first and second gate dielectric layers 110a and 110b. The first gate dielectric layer 110a may be etched to form a first gate dielectric pattern GIa on the first region Ra. While the first gate dielectric pattern GIa is formed, an upper portion of the second gate dielectric layer 110b may be etched. After the first gate dielectric pattern GIa is formed, a residue of the second gate dielectric layer 110b may remain on the second and third regions Rb and Rc.

First gate spacers GSP1 may be formed on lateral surfaces of the first gate electrode GEa, and third gate spacers GSP3 may be formed on lateral surfaces of the second gate electrode GEb. The formation of the first and third gate spacers GSP1 and GSP3 may include forming on the substrate 100 a gate spacer layer to have a substantially uniform thickness, and performing an anisotropic etching process on the gate spacer layer. The anisotropic etching process may expose a top surface of the upper semiconductor layer 104 on the first region Ra and may expose a top surface of the second gate dielectric layer 110b on the second and third regions Rb and Rc.

First impurity-doped regions IMa may be formed in the upper semiconductor layer 104 on opposite sides of the first gate electrode GEa. The first impurity-doped regions IMa may be formed by implanting P-type or N-type impurities into the upper semiconductor layer 104. Thereafter, a first semiconductor pattern SP1 may be formed on each of the first impurity-doped regions IMa. The first semiconductor pattern SP1 may be formed by, for example, a selective epitaxial growth process in which the upper semiconductor layer 104 is used as a seed.

Figure 16:
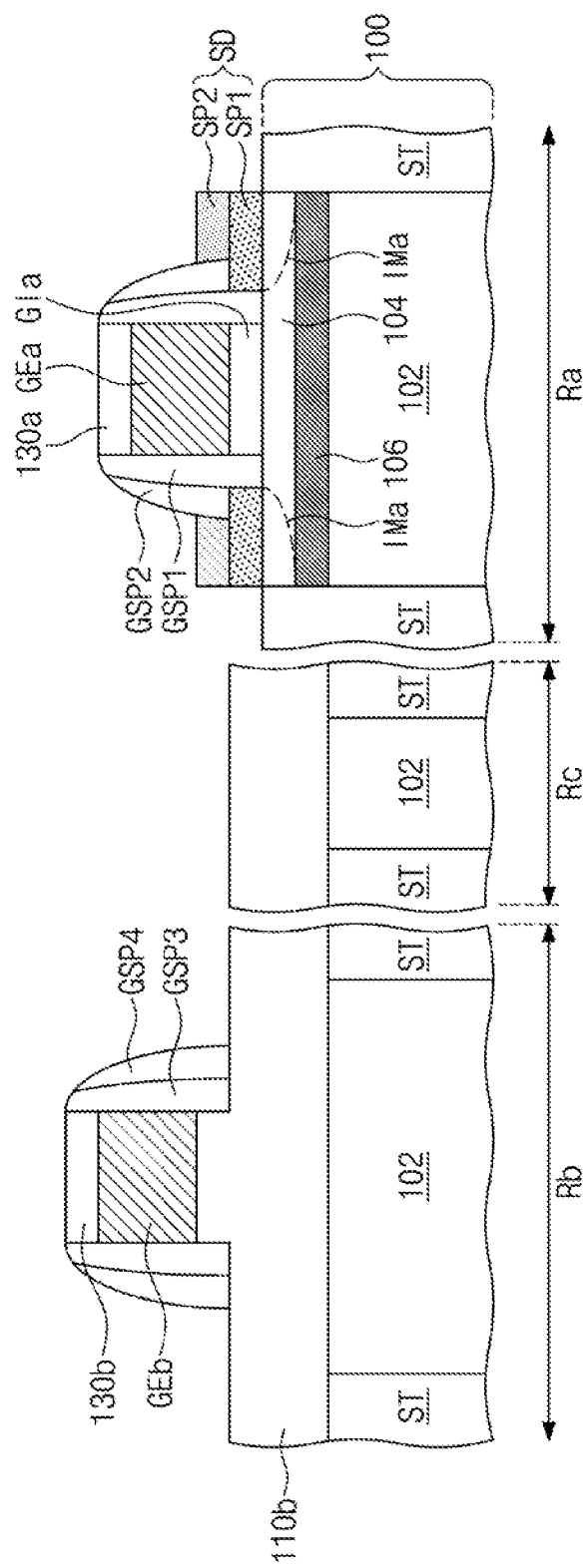

Referring to FIG. 16, second gate spacers GSP2 may be formed on the lateral surfaces of the first gate electrode GEa, and fourth gate spacers GSP4 may be formed on the lateral surfaces of the second gate electrode GEb. After that, a second semiconductor pattern SP2 may be formed on the first semiconductor pattern SP1. The first semiconductor pattern SP1 and the second semiconductor pattern SP2 may constitute a source/drain pattern SD. A pair of source/drain patterns SD may be correspondingly formed on the first impurity-doped regions IMa.

Figure 17:
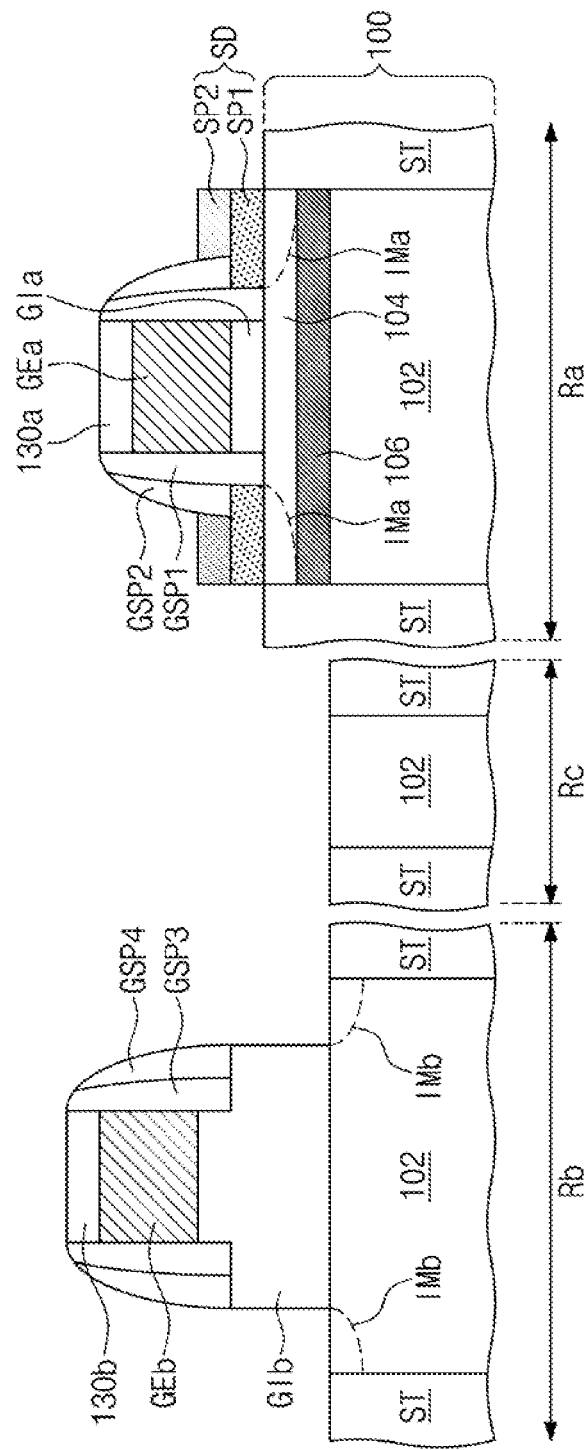

Referring to FIG. 17, the residue of the second gate dielectric layer 110b may be etched to form a second gate dielectric pattern GIb on the second region Rb. The formation of the second gate dielectric pattern GIb may expose the lower semiconductor layer 102 on the second region Rb. While the second gate dielectric pattern GIb is formed, the residue of the second gate dielectric layer 110b may be removed from the third region Rc, and thus the lower semiconductor layer 102 may be exposed on the third region Rc.

Second impurity-doped regions IMb may be formed in the lower semiconductor layer 102 on opposite sides of the second gate electrode GEb. The second impurity-doped regions IMb may be formed by implanting P-type or N-type impurities into the lower semiconductor layer 102.

Figure 18:
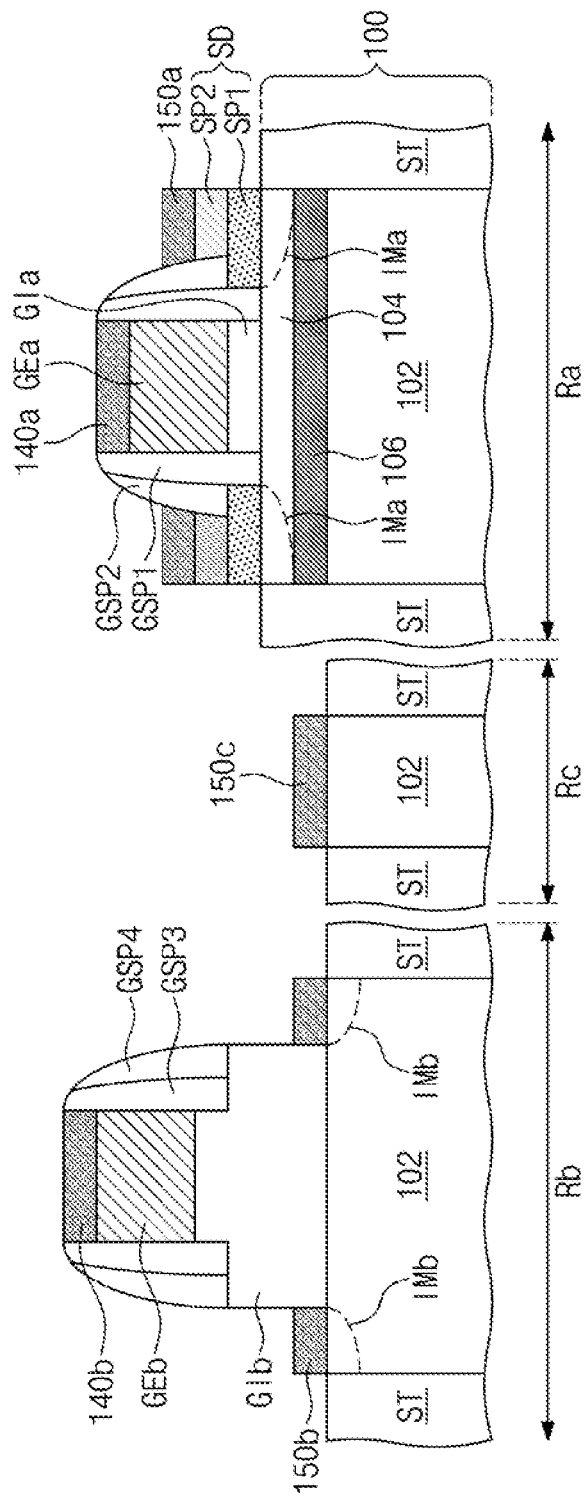

Referring to FIG. 18, the first and second mask patterns 130a and 130b (see FIG. 17) may be selectively removed. Thereafter, a first gate ohmic pattern 140a and a second gate ohmic pattern 140b may be respectively formed on the first gate electrode GEa and the second gate electrode GEb. First ohmic patterns 150a may be formed on corresponding source/drain patterns SD, and second ohmic patterns 150b may be formed on corresponding second impurity-doped regions IMb. A third ohmic pattern 150c may be formed on the lower semiconductor layer 102 in the third region Rc.

The first and second gate ohmic patterns 140a and 140b and the first, second, and third ohmic patterns 150a, 150b, and 150c may be formed by using substantially the same method discussed with reference to FIG. 6. Except for the mentioned above description, a semiconductor device fabrication method according to the present embodiment is substantially the same as the semiconductor device fabrication method discussed with reference to FIGS. 2 to 6.

According to the present inventive concept, first and second gate contacts, first and second source/drain contacts, and a body contact may each have widths that may vary in proportion to their vertical lengths (or heights). Therefore, it may be possible to readily form the first and second gate contacts, the first and second source/drain contacts, and the body contact, which may result in easy formation of transistors having different operating characteristics. Accordingly, a semiconductor device may be effortlessly fabricated which includes the transistors having different operating characteristics.

While the present inventive concept has been described with reference to exemplary embodiments thereof, it will be understood by those of ordinary skill in the art that various changes in form and details may be made thereto without departing from the spirit and scope of the present inventive concept as defined by the following claims.

What is claimed is:

1. A method for forming a semiconductor device, comprising:
    providing a substrate including a first region and a second region;
    forming a first gate dielectric pattern and a first gate electrode stacked on the first region of the substrate;
    forming a second gate dielectric pattern and a second gate electrode stacked on the second region of the substrate;
    forming an interlayer dielectric layer covering the first gate dielectric pattern and the first gate electrode on the first region of the substrate, and covering the second gate dielectric pattern and the second gate electrode on the second region of the substrate;
    forming first source/drain contact holes penetrating the interlayer dielectric layer on the first region of the substrate and at opposite sides of the first gate electrode;
    forming second source/drain contact holes penetrating the interlayer dielectric layer on the second region of the substrate and at opposite sides of the second gate electrode;
    forming a first gate contact hole penetrating the interlayer dielectric layer on the first region of the substrate and overlapping the first gate electrode;
    forming source/drain patterns directly on a top surface of the substrate and at opposite sides of the first gate electrode, in the first region;
    forming first ohmic patterns on an upper surface of the source/drain patterns, respectively, wherein the first ohmic patterns include a metal silicide disposed on the top surface of the substrate; and
    forming second ohmic patterns directly on the top surface of the substrate and at opposite sides of the second gate electrode, in the second region;
    wherein a thickness of the second gate dielectric pattern is greater than a thickness of the first gate dielectric pattern,
    wherein a height of each of the second source/drain contact holes is greater than a height of each of the first source/drain contact holes, and a width of each of the second source/drain contact holes is greater than a width of each of the first source/drain contact holes,
    wherein a width of the first gate contact hole is less than the width of each of the first source/drain contact holes.

2. The method of claim 1, wherein the first source/drain contact holes expose the first ohmic patterns, respectively.

3. The method of claim 2, wherein the second source/drain contact holes expose the second ohmic patterns, respectively.

4. The method of claim 3, wherein the first ohmic patterns are in contact with uppermost surfaces of the source/drain patterns, and the second ohmic patterns are in contact with the second region of the substrate.

5. The method of claim 3, wherein the first ohmic patterns are spaced apart from the top surface of the substrate and are located at a higher level than that of the second ohmic patterns from the top surface of the substrate.

6. The method of claim 1, further comprising
    forming first source/drain contacts in the first source/drain contact holes, respectively; and
    forming second source/drain contacts in the second source/drain contact holes, respectively,
    wherein a height of each of the second source/drain contacts is greater than a height of each of the first source/drain contacts, and a width of each of the second source/drain contacts is greater than a width of each of the first source/drain contacts.

7. The method of claim 6, wherein top surfaces of the second source/drain contacts are located at a same level as top surfaces of the first source/drain contacts.

8. The method of claim 7, wherein bottom surfaces of the second source/drain contacts are located at a lower level than bottom surfaces of the first source/drain contacts.

9. The method of claim 1, wherein the interlayer dielectric layer is formed over the first ohmic patterns.

10. A method for forming a semiconductor device, comprising:
    providing a substrate including a first region and a second region;
    forming a first gate dielectric pattern and a first gate electrode stacked on the first region of the substrate;
    forming a second gate dielectric pattern and a second gate electrode stacked on the second region of the substrate;
    forming an interlayer dielectric layer covering the first gate dielectric pattern and the first gate electrode on the first region of the substrate, and covering the second gate dielectric pattern and the second gate electrode on the second region of the substrate;
    forming first source/drain contacts penetrating the interlayer dielectric layer on the first region of the substrate and at opposite sides of the first gate electrode;
    forming second source/drain contacts penetrating the interlayer dielectric layer on the second region of the substrate and at opposite sides of the second gate electrode;
    forming a first gate contact penetrating the interlayer dielectric layer on the first region of the substrate and overlapping the first gate electrode;
    forming source/drain patterns directly on a top surface of the substrate and at opposite sides of the first gate electrode, in the first region;
    forming first ohmic patterns on an upper surface of the source/drain patterns, respectively, wherein the first ohmic patterns include a metal silicide disposed on the top surface of the substrate; and forming second ohmic patterns directly on the top surface of the substrate and at opposite sides of the second gate electrode, in the second region;

wherein a thickness of the second gate dielectric pattern is greater than a thickness of the first gate dielectric pattern, wherein a height of each of the second source/drain contacts is greater than a height of each of the first source/drain contacts, and a width of each of the second source/drain contacts is greater than a width of each of the first source/drain contacts, wherein a width of the first gate contact is less than the width of each of the first source/drain contacts.

11. The method of claim 10, further comprising:

forming a plurality of connection line patterns on the interlayer dielectric layer, wherein each of the first and second source/drain contacts is connected to a corresponding connection line pattern of the plurality of connection line patterns.

12. The method of claim 11, wherein the plurality of connection line patterns are located at a same level from a top surface of the substrate.

13. The method of claim 10, wherein the first ohmic patterns are spaced apart from the top surface of the substrate and are located at a higher level than that of the second ohmic patterns from the top surface of the substrate.

14. The method of claim 10, wherein the interlayer dielectric layer is formed over the first ohmic patterns.

* * * * *